United States Patent
Kaneko et al.

(10) Patent No.: US 10,658,426 B2
(45) Date of Patent: May 19, 2020

(54) MAGNETIC ELEMENT, SKYRMION MEMORY, SKYRMION MEMORY-MOUNTED CENTRAL PROCESSING LSI, DATA RECORDING APPARATUS, DATA PROCESSING APPARATUS, AND DATA COMMUNICATION APPARATUS

(71) Applicant: RIKEN, Saitama (JP)

(72) Inventors: Yoshio Kaneko, Saitama (JP); Yoshinori Tokura, Saitama (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 16/416,317

(22) Filed: May 20, 2019

(65) Prior Publication Data
US 2019/0267427 A1  Aug. 29, 2019

Related U.S. Application Data

(63) Continuation of application No. PCT/JP2017/039829, filed on Nov. 2, 2017.

(30) Foreign Application Priority Data

Nov. 18, 2016 (JP) .................................. 2016-225281

(51) Int. Cl.
*G11C 11/16* (2006.01)
*G11C 19/08* (2006.01)
(Continued)

(52) U.S. Cl.
CPC .......... *H01L 27/228* (2013.01); *G11C 11/161* (2013.01); *G11C 11/1659* (2013.01);
(Continued)

(58) Field of Classification Search
CPC .. H01L 27/228; H01L 11/161; H01L 11/1659; H01L 11/1673; H01L 11/1675; H01L 43/02
(Continued)

(56) References Cited

U.S. PATENT DOCUMENTS 10,195,748 B2   2/2019   Uetabira
2012/0020152 A1  1/2012   Gaudin
(Continued)

FOREIGN PATENT DOCUMENTS

JP  2004153182      5/2004
JP  2013536574 A    9/2013
(Continued)

OTHER PUBLICATIONS

International Search Report for International Patent Application No. PCT/JP2017/039829, issued/mailed by the Japan Patent Office dated Dec. 26, 2017.
(Continued)

*Primary Examiner* — Ly D Pham

(57) ABSTRACT

To provide a high-speed, large-scale non-volatile skyrmion random access memory that prevents incorrect writing and incorrect erasure, has a circuit with good storage-data sensitivity, generates smaller leakage current, and consumes less power. To provide a magnetic element for generating and erasing a skyrmion including: a first magnetic material thin film in which the skyrmion is generated and erased; a sensing element for sensing the skyrmion; and at least one of a first transistor for selecting the first magnetic material thin film, and a second transistor for selecting the skyrmion sensing element.

20 Claims, 21 Drawing Sheets

(51) Int. Cl.
  *G11C 11/00* (2006.01)
  *G11C 11/18* (2006.01)
  *G11C 11/14* (2006.01)
  *H01L 27/22* (2006.01)
  *H01L 43/02* (2006.01)
  *H01L 27/105* (2006.01)
  *H01L 43/08* (2006.01)
  *H01L 21/8239* (2006.01)
  *H01L 29/82* (2006.01)

(52) U.S. Cl.
  CPC ...... *G11C 11/1673* (2013.01); *G11C 11/1675* (2013.01); *H01L 21/8239* (2013.01); *H01L 27/105* (2013.01); *H01L 29/82* (2013.01); *H01L 43/02* (2013.01); *H01L 43/08* (2013.01)

(58) Field of Classification Search
  USPC ........................................................ 365/158
  See application file for complete search history.

(56) References Cited

U.S. PATENT DOCUMENTS

| | | | |
|---|---|---|---|
| 2013/0201755 A1 | 8/2013 | Ezaki | |
| 2017/0076770 A1 | 3/2017 | Daibou | |
| 2017/0169898 A1* | 6/2017 | Nagaosa | ................ G11B 5/65 |
| 2017/0178746 A1 | 6/2017 | Nagaosa | |
| 2017/0178747 A1* | 6/2017 | Tokunaga | ............... H01L 43/08 |
| 2017/0178748 A1 | 6/2017 | Nagaosa | |
| 2017/0179375 A1 | 6/2017 | Nagaosa | |
| 2017/0179376 A1* | 6/2017 | Nakamura | ............ H01L 27/105 |
| 2017/0206921 A1 | 7/2017 | Nagaosa | |
| 2017/0256351 A1* | 9/2017 | Cros | ..................... H01F 10/324 |
| 2018/0114898 A1* | 4/2018 | Lee | ........................ G11C 11/161 |
| 2018/0240972 A1* | 8/2018 | Gilbert | .................... H01L 43/10 |
| 2019/0074044 A1* | 3/2019 | Atulasimha | ......... G11C 11/1659 |
| 2019/0131049 A1* | 5/2019 | Buttner | ............... H01F 10/3259 |

FOREIGN PATENT DOCUMENTS

| | | | | |
|---|---|---|---|---|
| JP | 2013243336 A | | 12/2013 | |
| JP | 2016136973 A | | 8/2016 | |
| JP | 5985728 B1 | | 9/2016 | |
| WO | WO-2015156727 A1 | * | 10/2015 | .......... H03B 15/006 |
| WO | 2016021349 A1 | | 2/2016 | |
| WO | WO-2016021349 A1 | * | 2/2016 | ............... G11B 5/02 |
| WO | 2016035579 A1 | | 3/2016 | |
| WO | 2016035758 A1 | | 3/2016 | |
| WO | 2016035759 A1 | | 3/2016 | |
| WO | WO-2016035579 A1 | * | 3/2016 | ........... H01L 27/105 |
| WO | WO-2016035758 A1 | * | 3/2016 | ............. H01L 43/08 |
| WO | 2016067744 A1 | | 5/2016 | |

OTHER PUBLICATIONS (ISA/237) Written Opinion of the International Search Authority for International Application Na PCT/JP2017/039829, issued/mailed by the International Bureau of WIPO dated Dec. 26, 2017.

Office Action issued for counterpart Japanese Application No. 2016-225281, issued by the Japan Patent Office dated Oct. 29, 2019 (drafted on Oct. 17, 2019).

* cited by examiner

SKYRMION 40

SKYRMION 40

SKYRMION 40

SKYRMION 40

SKYRMION 40

MAGNETIC ELEMENT, SKYRMION MEMORY, SKYRMION MEMORY-MOUNTED CENTRAL PROCESSING LSI, DATA RECORDING APPARATUS, DATA PROCESSING APPARATUS, AND DATA COMMUNICATION APPARATUS

The contents of the following Japanese patent application(s) are incorporated herein by reference:
NO. 2016-225281 filed in JP on Nov. 18, 2016 and
NO. PCT/JP2017/039829 filed on Nov. 2, 2017.

BACKGROUND

1. Technical Field

The present invention relates to a magnetic element capable of generating, erasing, and sensing skyrmions, a skyrmion memory, a skyrmion memory-mounted central processing LSI, a data recording apparatus, a data processing apparatus, and a data communication apparatus.

2. Related Art

There are conventional, known skyrmion memories that use magnetic elements capable of generating, and erasing skyrmions (e.g., Patent Literatures 1 to 4).

PRIOR ART LITERATURES

Patent Literatures

[Patent Literature 1] WO2016/035758
[Patent Literature 2] WO2016/035579
[Patent Literature 3] WO2016/021349
[Patent Literature 4] WO2016/067744

However, conventional skyrmion memories are disadvantageous in that they cause incorrect writing and incorrect erasure since leakage current is generated when required current is applied at the time of generation, and erasure of skyrmions. Furthermore, this results in current being caused to flow in an unnecessarily large amount, and so power consumption cannot be reduced sufficiently. In addition, circuits for selection of sensing elements that sense skyrmions are not clearly specified for conventional skyrmion memories.

General Disclosure

A first aspect of the present invention provides a magnetic element for generating and erasing a skyrmion, the magnetic element including: a first magnetic material thin film in which the skyrmion is generated and erased; a sensing element for sensing the skyrmion; and a transistor portion for selecting the first magnetic material thin film or the sensing element.

A second aspect of the present invention provides a skyrmion memory including: a plurality of magnetic elements, each of which is the magnetic element according to the first aspect, and which are arrayed in a matrix; and a magnetic field generating portion that faces the first magnetic material thin film, and is capable of applying a magnetic field to the first magnetic material thin film.

A third aspect of the present invention provides a skyrmion memory-mounted central processing LSI including a single chip having the skyrmion memory according to the second aspect, and a logic circuit element for central information processing.

A fourth aspect of the present invention provides a data recording apparatus including the skyrmion memory according to the second aspect.

A fifth aspect of the present invention provides a data processing apparatus including the skyrmion memory according to the second aspect.

A sixth aspect of the present invention provides a data communication apparatus comprising the skyrmion memory according to the second aspect.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Examples of magnetic materials that can form skyrmions include chiral magnetic materials. When not receiving external magnetic fields, chiral magnetic materials enter the magnetically ordered phase in which magnetic moments rotate spirally about the advancing direction of the magnetic moments (spiral magnetic phase). Upon receiving external magnetic fields, the chiral magnetic materials enter the ferromagnetic phase after the crystal phase in which skyrmions are arrayed in grids.

Figure 1:
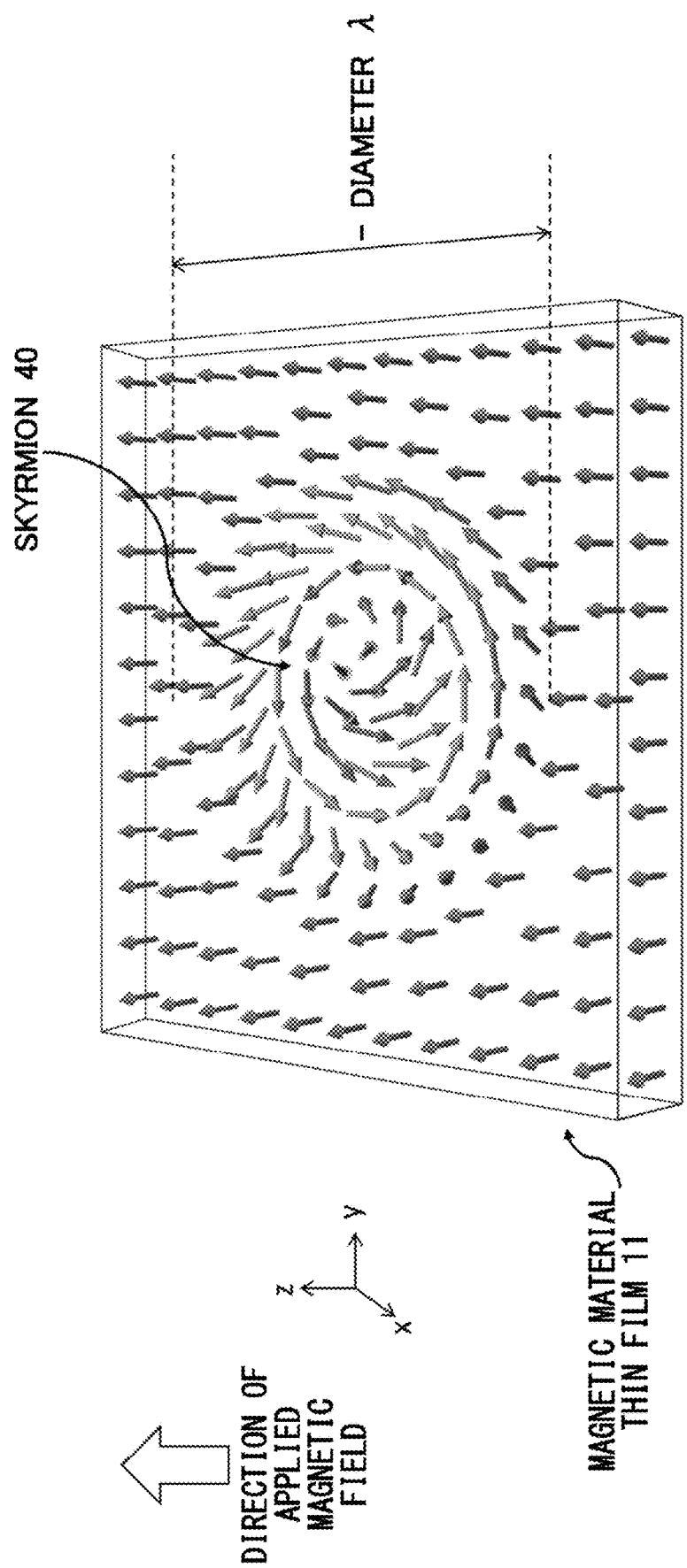
FIG. 1 is a schematic view illustrating an exemplary structure of the magnetic moment of a skyrmion 40 in a magnetic material thin film.

FIG. 1 is a schematic view illustrating an exemplary skyrmion 40 which is a nanoscale magnetic structure in a magnetic material thin film 11. In FIG. 1, each arrow indicates the direction of a magnetic moment in the skyrmion 40. The x axis, and y axis are orthogonal to each other, and the z axis is orthogonal to the x-y plane.

The magnetic material thin film 11 forms a plane parallel to the x-y plane. The magnetic moments pointing to all the directions in the magnetic material thin film 11 constitute the skyrmion 40. In the present example, the magnetic field applied to the magnetic material thin film 11 points to the +z direction. In this case, the magnetic moments of the outermost periphery of the skyrmion 40 in the present example point to the +z direction. In the present example, the outermost periphery means the circumference of the magnetic moments pointing to the same direction as the direction of the external magnetic field illustrated in FIG. 1.

The magnetic moments in the skyrmion 40 are arranged to rotate spirally inward from the outermost periphery. Furthermore, the directions of the magnetic moments pointing to the +z direction gradually shift to the −z direction at positions along the spiral and closer to the center of the spiral. The skyrmion 40 is a nanoscale magnetic structure having a spiral magnetic moment structure.

If the magnetic material thin film 11 in which the skyrmion 40 is observed is a thin, tabular solid material, the magnetic moments constituting the skyrmion 40 are formed of the same magnetic moments in the z direction. That is, the skyrmion 40 has a magnetic structure formed of magnetic moments pointing to the same direction from the front surface to the rear surface in the direction (z direction) of the depth of the magnetic material thin film 11 having a closed route shape.

FIG. 2A to FIG. 2D are schematic views illustrating skyrmions 40 that have different helicities γ (i.e., are different in terms of how magnetic moments twist). In particular, FIG. 2A to FIG. 2D illustrate examples in which the number of skyrmions Nsk=−1. If the number of skyrmions Nsk=−1, the skyrmions 40 have magnetic moments pointing to the −z direction at their centers.

Figure 2A:
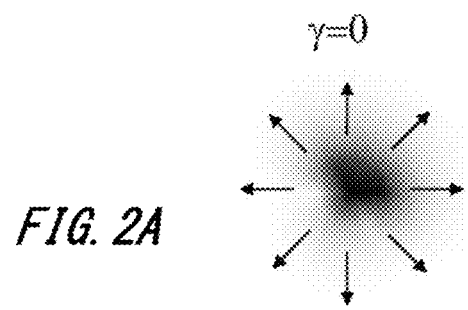
FIG. 2A is a figure illustrating a skyrmion generated when the number of skyrmions Nsk=−1, and the helicity γ=0.
Figure 2B:
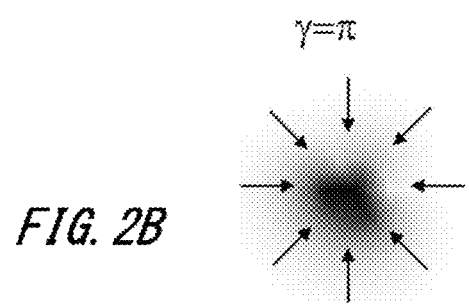
FIG. 2B is a figure illustrating a skyrmion 40 generated when the number of skyrmions Nsk=−1, and the helicity γ=π/2.
Figure 2C:
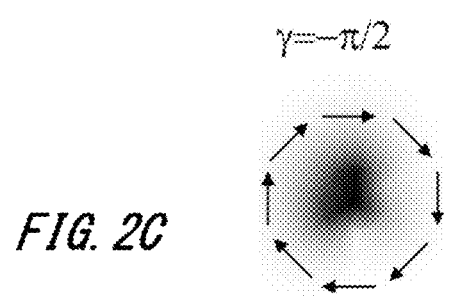
FIG. 2C is a figure illustrating a skyrmion 40 generated when the number of skyrmions Nsk=−1, and the helicity γ=π/2.
Figure 2D:
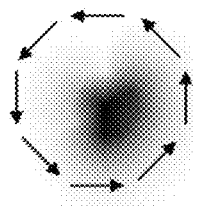
FIG. 2D is a figure illustrating a skyrmion 40 generated when the number of skyrmions Nsk=−1, and the helicity γ=π/2.
Figure 2E:
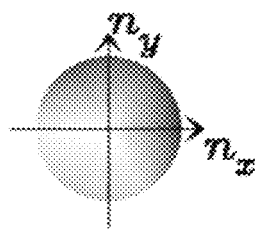
FIG. 2E illustrates, using shading, the intensity of projected components of a magnetic moment onto an (x, y) plane. $n_x \cdot n_y$ means the unit vector.

FIG. 2E illustrates how the coordinates of magnetic moments are defined (right-handed system). Note that since the right-handed system is adopted here, the $n_z$ axis, relative to the $n_x$ axis, and $n_y$ axis, points to the direction out from the sheet of paper. In addition, the relationship between shading, and the directions of magnetic moments is illustrated in FIG. 2E.

The number of skyrmions Nsk characterizes a skyrmion 40, which is a nanoscale magnetic structure having a spiral structure. The following [Formula 1] and [Formula 2] represent the number of skyrmions Nsk. In [Formula 2], the polar angle Θ(r) between a magnetic moment and the z axis is a continuous function of the distance r from the center of a skyrmion 40. The polar angle Θ(r) changes from π to zero or from zero to π if r is changed from 0 to ∞.

$$Nsk = \frac{1}{4\pi} \int\int d^2 rn(r) \cdot \left[\left(\frac{\partial n(r)}{\partial x}\right) \times \left(\frac{\partial n(r)}{\partial y}\right)\right] \quad \text{[Formula 1]}$$

$$n(r) = (\cos\Phi(\varphi)\sin\Theta(r), \sin\Phi(\varphi)\sin\Theta(r), \cos\Theta(r)) \quad \text{[Formula 2]}$$
$$\Phi(\varphi) = m\varphi + \gamma$$

The vector amount n(r) represents the direction of a magnetic moment of a skyrmion 40 at a position r.

In [Formula 2], m is vorticity, and γ is helicity. According to [Formula 1] and [Formula 2], if r is changed from 0 to ∞, and so Θ(r) changes from π to zero, Nsk=−m.

FIG. 2A to FIG. 2D are schematic views illustrating skyrmions 40 having different helicities γ. In particular, FIG. 2A to FIG. 2D illustrate examples in which the number of skyrmions Nsk=−1.

FIG. 2E illustrates how the coordinates of magnetic moments are defined (right-handed system). Note that since the right-handed system is adopted here, the $n_z$ axis, relative to the $n_x$ axis, and $n_y$ axis, points to the direction out from the sheet of paper. In addition, the relationship between shading, and the directions of magnetic moments is illustrated in FIG. 2E.

In FIG. 2A to FIG. 2D, shading indicates the directions of magnetic moments. Each arrow in FIG. 2A to FIG. 2D indicates a magnetic moment which is a predetermined distance apart from the center of a skyrmion 40. Magnetic structures illustrated in FIG. 2A to FIG. 2D are in the state of defining skyrmions 40. An area with the lightest shading like the outermost peripheries in FIG. 2A to FIG. 2D indicates magnetic moments pointing to the direction out from the sheet of paper. Note that the magnetic moments are represented in white in the figures. An area with the darkest shading like the centers in FIG. 2A to FIG. 2D indicates magnetic moments pointing to the direction into the sheet of paper.

The direction of each magnetic moment in FIG. 2B (γ=π) is different from the direction of a corresponding magnetic moment in FIG. 2A (γ=0) by 180°. The direction of each magnetic moment in FIG. 2C (γ=−π/2) is different from the direction of a corresponding magnetic moment in FIG. 2A (γ=0) by −90 degrees (90 degrees in the clockwise direction).

The direction of each magnetic moment in FIG. 2D (γ=π/2) is different from the direction of a corresponding magnetic moment in FIG. 2A (γ=0) by 90 degrees (90 degrees in the counterclockwise direction). Note that the skyrmion 40 having the helicity γ=π/2 illustrated in FIG. 2D corresponds to the skyrmion 40 in FIG. 1.

Although the magnetic structures in the four examples illustrated in FIG. 2A to FIG. 2D look different, they are the same magnetic structure topologically. The skyrmions 40 having the structures illustrated in FIG. 2A to FIG. 2D stays stably once generated, and function as the carrier for information transfer in the magnetic material thin film 11 having received an external magnetic field.

Figure 3:
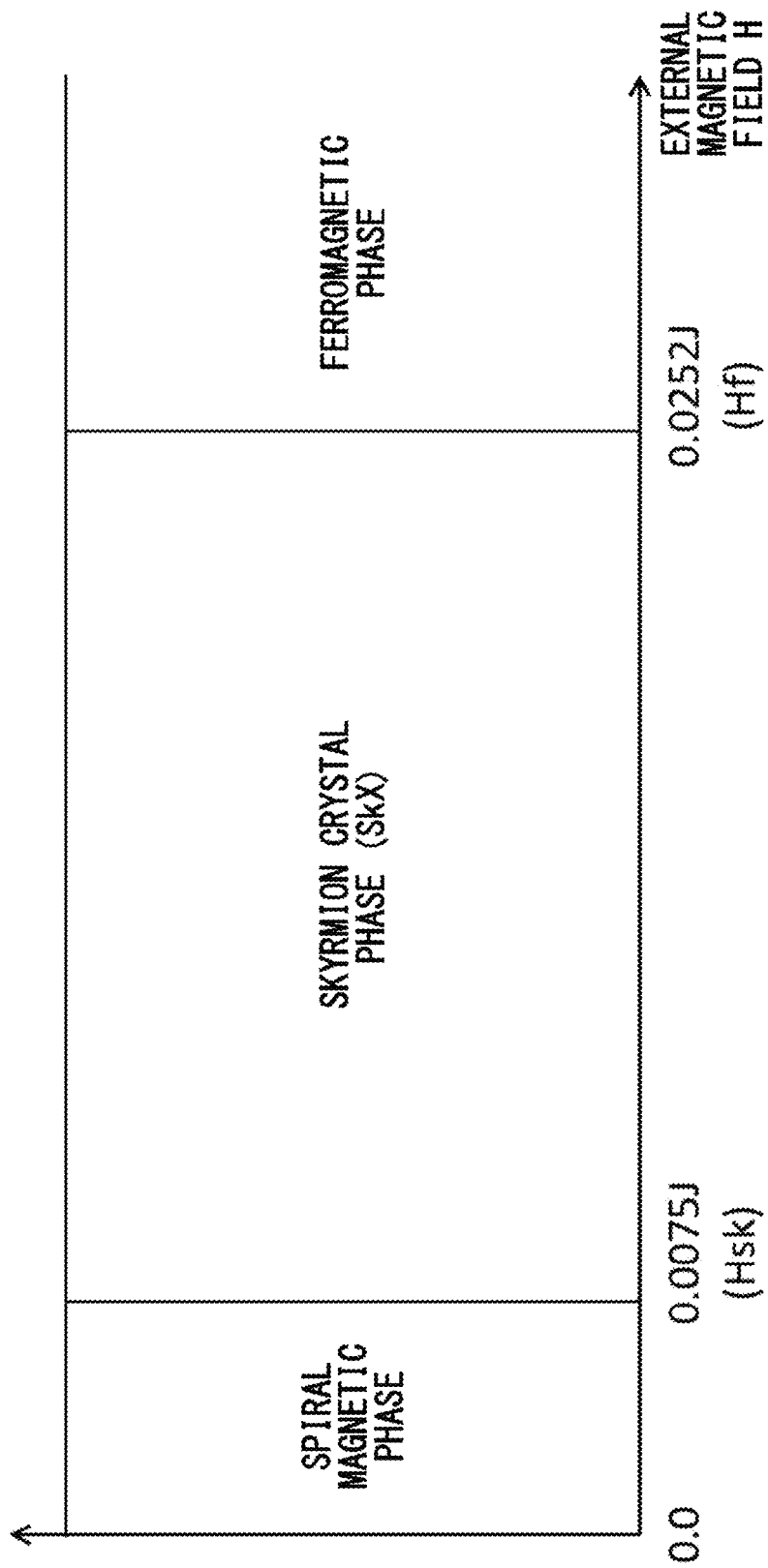
FIG. 3 is a phase diagram illustrating magnetic field dependence of a chiral magnetic material magnetic phase of a magnetic material thin film.

FIG. 3 is a phase diagram illustrating the magnetic field dependence of magnetic material magnetic phases. Chiral magnetic materials are magnetic material thin films that exit the chiral magnetic phase, and enter the skyrmion crystal phase (SkX) upon receiving magnetic fields with a magnetic field intensity Hsk, and exit the skyrmion crystal phase (SkX), and enter the ferromagnetic phase upon receiving magnetic fields with a still stronger magnetic field intensity Hf. In the skyrmion crystal phase (SkX), a plurality of skyrmions 40 are generated on the x-y plane in an aligned state with the densest structure.

Next, J is defined as the magnitude of a magnetic exchange interaction of this type of magnetic material thin film, and, using the amount, various types of physical amounts are described as standardized values. In this case, the magnetic material thin film exits the chiral phase in which it has a magnetic structure with spiral magnetic moments when receiving a weak magnetic field, and enters the skyrmion crystal phase upon receiving a magnetic field with the magnetic field intensity Hsk=0.0075 J. The diameter $\lambda$ of a skyrmion 40 can be expressed as $\lambda=2\pi\sqrt{2}\cdot J\times a/D$. Here, a is the lattice constant of the magnetic material thin film 11, and D is the material-specific physical constant of the magnitude of the Dzyaloshinskii-Moriya interaction. Accordingly, the skyrmion diameter $\lambda$ is a material-specific constant. The skyrmion diameter $\lambda$ is 70 nm for FeGe, and 18 nm for MnSi, for example.

First Embodiment

Figure 4:
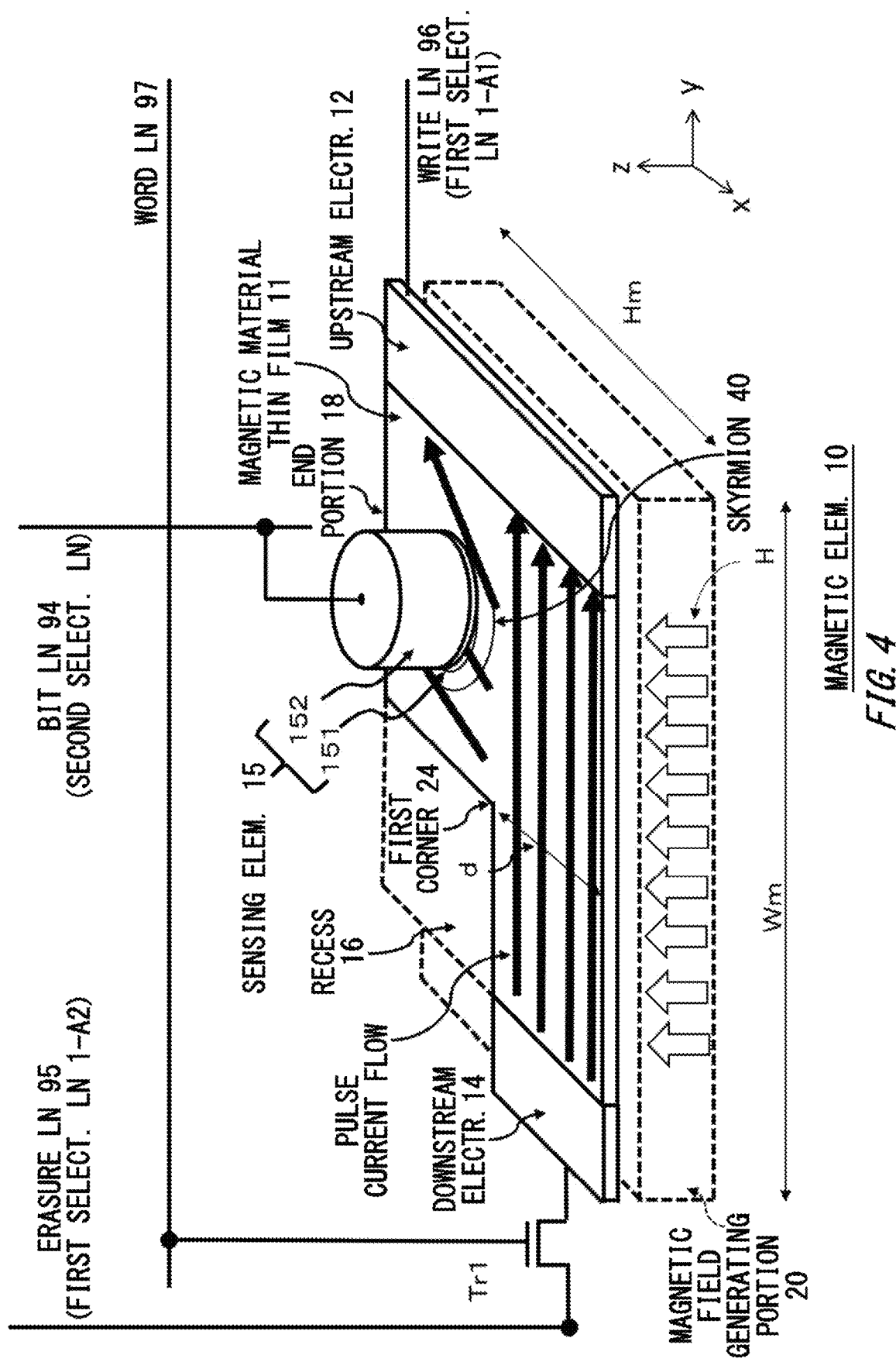
FIG. 4 illustrates an exemplary configuration of a magnetic element 10 according to a first embodiment.

FIG. 4 illustrates an exemplary configuration of a magnetic element 10 according to a first embodiment. The magnetic element 10 illustrated in FIG. 4 enables generation, and erasure of one skyrmion 40 using pulse current. For example, the presence or absence of a skyrmion 40 at a predetermined position in the magnetic material thin film 11 corresponds to one-bit information. The magnetic element 10 saves (stores) information using the skyrmion 40. The magnetic element 10 in the present example includes a magnetic material thin film 11, an upstream electrode 12, a downstream electrode 14, a sensing element 15, an erasure line 95, a write line 96, a word line 97, a bit line 94, and a transistor Tr1. Note that the transistor Tr1 is an exemplary transistor portion for selecting a skyrmion generating portion having the magnetic material thin film 11, upstream electrode 12, and downstream electrode 14, an erasing unit, or the sensing element 15. In addition, a magnetic field generating portion 20 provided outside the magnetic element 10 and not constituting the magnetic element 10 is indicated with dashed lines. The (x, y, z) coordinate system is illustrated in FIG. 4.

The upstream electrode 12 is connected to one end of the magnetic material thin film 11. The upstream electrode 12 is connected to one end of the magnetic material thin film 11 in its direction of extension. In the present example, the direction of extension of the magnetic material thin film 11 means the direction parallel to the x-y plane. The upstream electrode 12 may be stacked on an end portion of the magnetic material thin film 11. The upstream electrode 12 may have a thin layer shape. In addition, the upstream electrode 12 may have the same thickness as that of the magnetic material thin film 11. The upstream electrode 12 is connected to the write line 96. In one embodiment, the upstream electrode 12 is made of a conductive non-magnetic material thin film metal such as Cu, W, Ti, TiN, Al, Pt, or Au. Note that the write line 96 is an exemplary first selection line 1-A1.

The downstream electrode 14 is spaced apart from the upstream electrode 12, and is connected to the magnetic material thin film 11. The downstream electrode 14 in the present example is connected to another end of the magnetic material thin film 11, the end being opposite to the one end to which the upstream electrode 12 is connected. The downstream electrode 14 may be connected to one end of the magnetic material thin film 11 in its direction of extension. The downstream electrode 14 may be stacked on an end portion of the magnetic material thin film 11. The upstream electrode 12, and downstream electrode 14 are arranged such that if a voltage is applied, current flows through the magnetic material thin film 11 in a direction almost parallel to the x-y plane. The downstream electrode 14 is connected to the erasure line 95. In one embodiment, the downstream electrode 14 is made of a conductive non-magnetic material thin film metal such as Cu, W, Ti, TiN, Al, Pt, or Au. Note that the erasure line 95 is an exemplary first selection line 1-A2.

The magnetic material thin film 11 exhibits at least the skyrmion crystal phase or ferromagnetic phase depending on an applied magnetic field. That the magnetic material thin film 11 is a magnetic material that exhibits the skyrmion crystal phase and ferromagnetic phase is a condition essential for a skyrmion 40 to be generated in the magnetic material thin film 11. For example, the magnetic material thin film 11 is a chiral magnetic material, and is formed of FeGe or MnSi with the B20 structure, or CoZn or CoZnMn with the βMn structure. In addition, the magnetic material thin film 11 may be a stacked structure of a magnetic material, and a non-magnetic material. A magnetic material thin film having a stacked thin-film structure of a magnetic material thin film, and a non-magnetic material thin film is a stacked magnetic material thin film having magnetic moments modulated by the spin-orbit interaction of the non-magnetic material thin film. The magnetic material thin film 11 can be formed using an exposure apparatus, an etching apparatus, or CMP (Chemical Mechanical Planarization) on a magnetic material thin film formed using an MBE (Molecular Beam Epitaxy) apparatus, a sputtering apparatus, or the like.

The magnetic material thin film 11 has a thin-film shape. The magnetic material thin film 11 has an approximately rectangular shape with a width Wm and a length Hm on the thin-film plane. The width Wm of the magnetic material thin film 11 satisfies $3\lambda > Wm \geq \lambda$, and the length Hm of the magnetic material thin film 11 satisfies $2\lambda > Wm \geq \lambda$ ($\lambda$ is the skyrmion diameter). The magnetic material thin film 11 has a recess at an end portion sandwiched by the upstream electrode and the downstream electrode.

In addition, the magnetic material thin film 11 may be surrounded by a non-magnetic, insulating material or the like typically used in semiconductor processes. A non-magnetic insulator thin film is provided between the magnetic material thin film 11, and a magnetic material thin film 11 of an adjacent magnetic element 10. The magnetic material thin film 11 may have a thickness equal to or smaller than about 1000% of the diameter $\lambda$ of the skyrmion 40, for example.

The transistor Tr1 is provided between the downstream electrode 14 and the erasure line 95. For example, the transistor Tr1 is a field-effect transistor (FET: Field Effect Transistor). The gate terminal of the transistor Tr1 is connected to the word line 97. The transistor Tr1 inhibits a flow of leakage current via the corresponding magnetic element 10 when the magnetic element 10 is not selected. Thereby, it is possible to prevent incorrect writing in or incorrect erasure from a magnetic element 10 which is not a writing/erasure target. Furthermore, since leakage current can be blocked, power consumption can be reduced. Furthermore, the transistor Tr1 doubles as a transistor to select a sensing element 15. By being provided between the downstream electrode 14 and the erasure line 95 The transistor Tr1 enables reading of data in a selected magnetic element 10.

It is also possible to provide the transistor Tr1 between the upstream electrode 12 and the write line 96. The gate terminal of the transistor Tr1 is connected to the word line 97. The transistor Tr1 inhibits a flow of leakage current via the corresponding magnetic element 10 when the magnetic element 10 is not selected. In addition, the above-mentioned matters apply also to the transistor Tr1, in that the transistor Tr1 functions as a transistor to select a sensing element 15.

It is also possible to provide a transistor Tr2 between the bit line 94, and a magnetic material metal thin film 152 that is part of the sensing element 15, and is a magnetic material metal. If the magnetic material of the magnetic material thin film 11 has a high electric resistance, the resistance between the sensing element 15 and the downstream electrode 14 is high. In such a case, it is easier to read out changes in the resistance of the sensing element 15 resulting from the presence or absence of a skyrmion by sensing the resistance between the magnetic material metal thin film 152 of the sensing element 15, and the upstream electrode 12. The gate terminal of the transistor Tr2 is connected to the word line 97. The transistor Tr1 is used for current at the time of generating and erasing a skyrmion 40, and the transistor Tr2 is used for sensing a skyrmion 40. In this case, two transistors are required as magnetic elements.

A direction of current is selected for the upstream electrode 12, and downstream electrode 14 among the direction from the upstream electrode 12 toward the downstream electrode 14, and the direction from the downstream electrode 14 toward the upstream electrode 12, which current is applied to the magnetic material thin film 11 as a pulse current. If a skyrmion 40 is to be generated in the magnetic material thin film 11, the magnetic element 10 applies a pulse current to the magnetic material thin film 11 in the direction from the upstream electrode 12 toward the downstream electrode 14. FIG. 4 illustrates a flow of pulse electrons through the magnetic material thin film 11 with black line arrows. An electron flow flows in the direction opposite to the direction of current. In addition, if a skyrmion 40 present in the magnetic material thin film 11 is to be erased, the magnetic element 10 applies a pulse current to the magnetic material thin film 11 in the direction from the downstream electrode 14 toward the upstream electrode 12.

The magnetic material thin film 11 has a recess 16 at an end portion 18. The end portion 18 in the present example is one of end portions of the magnetic material thin film 11, and is sandwiched by the upstream electrode 12 and the downstream electrode 14. In a more specific example, the end portion 18 is an upper or lower end portion of the magnetic material thin film 11 when the magnetic material thin film 11 is arranged such that the upstream electrode 12 is a right electrode, and the downstream electrode 14 is a left electrode. The recess 16 is spaced apart from both the upstream electrode 12, and the downstream electrode 14 at the end portion 18. In the present example, an end portion of the recess 16 on the downstream electrode 14 side covers an end portion of the magnetic material thin film 11 on the downstream electrode 14 side. The magnetic element 10 includes an L-shaped magnetic material thin film 11. A non-magnetic material thin film may be provided inside the recess 16.

The magnetic element 10 uses, as an information storage medium, a single skyrmion 40 generated by current. A pulse electron flow can generate a single skyrmion 40 from the recess 16 of the magnetic material thin film 11. In the present example, a first corner 24 is one of corners of the recess 16, and is opposite to the upstream electrode 12. A pulse current is caused to flow from the upstream electrode 12 to the downstream electrode 14. That is, the pulse electron flow is applied from the downstream electrode 14. As a result, a skyrmion 40 is generated from a portion near the first corner 24. The recess 16 may have a side parallel to the upstream electrode 12, or a side parallel to the downstream electrode 14. The first corner 24 may be an end portion of the side parallel to the upstream electrode 12. The recess 16 in the present example is quadrangular. Note that the shape of the recess 16 is not limited to a quadrangular shape. The shape of the recess 16 may be polygonal. In addition, each side of the recess 16 may not be linear. In addition, the first corner 24 of the recess 16 may be rounded.

The magnetic material thin film 11 is caused to enter the ferromagnetic phase by the magnetic field generating portion 20. Because of this, magnetic moments in the magnetic material thin film 11 point to the same direction as that of a magnetic field H. Note that magnetic moments at end portions of the magnetic material thin film 11 do not point to the same direction as that of the magnetic field H, but inclined to the magnetic field H. In particular, the inclinations of the magnetic moments vary continuously near the first corner 24 of the recess 16. Because of this, it is easier for skyrmions 40 to be generated at the first corner 24 of the magnetic material thin film 11 as compared to other areas and a skyrmion 40 can be generated by a predetermined pulse electron flow.

The first corner 24 is formed to have a predetermined interior angle. In one embodiment, the interior angle of the first corner 24 is equal to or larger than 180°. Here, the interior angle of the first corner 24 of the recess 16 means the angle of the magnetic material thin film 11 side of the first corner 24. For example, in the present example, the interior angle of the first corner 24 adjacent to the upstream electrode 12 is 270°. If the interior angle of the first corner 24 is 270°, magnetic moments near the first corner 24 that are observed while a current is not being applied most resemble a spiral. Because of this, the interior angle of the first corner 24 is preferably 270° in terms of generation of a skyrmion 40.

In addition, a skyrmion 40 can be erased by causing a pulse current to flow through the magnetic material thin film 11 from the downstream electrode 14 toward the upstream electrode 12. The direction of the pulse electron flow should be reverse to that mentioned with reference to FIG. 3. A skyrmion 40 is driven into the first corner 24, and erased by causing a pulse current to flow through the magnetic material thin film 11 from the upstream electrode 12 toward the downstream electrode 14. By making the shortest distance d between the first corner 24 and an end portion of the magnetic material thin film 11 shorter than a predetermined length, the skyrmion 40 can be driven into the first corner 24, and erased.

The sensing element 15 is a tunnel magneto resistance element (TMR element). The sensing element 15 in the present example is provided between the upstream electrode 12, and the first corner 24 of the recess 16. The sensing element 15 has a stacked structure of a non-magnetic insulator thin film 151 formed on the magnetic material thin film 11, and the magnetic material metal thin film 152 formed of a metal formed on the non-magnetic insulator thin film 151. The sensing element 15 measures the value of resistance of the non-magnetic insulator thin film 151 between the magnetic material metal thin film 152 and the magnetic material thin film 11. If a skyrmion 40 is present in the magnetic material thin film 11, the resistance of the non-magnetic insulator thin film 151 has the highest value, and if a skyrmion 40 is not present, the resistance of the non-magnetic insulator thin film 151 has the lowest value. The high resistance (H) state, and low resistance (L) state of the sensing element 15 correspond to the presence and absence of a skyrmion 40, and correspond to information "1" and "0" stored in a memory cell.

The sensing element 15 is a tunnel magneto resistance element (TMR) element. The sensing element 15 utilizes a characteristic that the resistance of an insulator thin film sandwiched by magnetic material metal thin films is dependent on the state of magnetic moments of both the magnetic material thin films. The magnetic material metal thin film 152 constituting the sensing element 15 has magnetic moments in the z direction due to a magnetic field from the magnetic field generating portion 20. Here, if a skyrmion 40 is present, the magnetic moments of the magnetic material thin film 11 form a spiral. The quantum effect on a tunneling electron flow flowing though the non-magnetic insulator thin film 151 is reduced. As a result, the tunneling current flowing through the non-magnetic insulator thin film 151 decreases. That is, the resistance of the non-magnetic insulator thin film 151 has the highest value. If a skyrmion 40 is not present, magnetic moments M in the z direction which is the same direction as that of the magnetic field H of the magnetic field generating portion 20 are generated in the magnetic material thin film 11. In addition, magnetic moments M in the z direction which is the same direction as that of the magnetic field H of the magnetic field generating portion 20 are generated also in the magnetic material metal thin film 152. In this case, a larger amount of a tunneling current flows through the non-magnetic insulator thin film 151 between the magnetic material metal thin film 152 and the magnetic material thin film 11 due to the quantum effect. That is, the resistance of the non-magnetic insulator thin film 151 has the lowest value. As a result, the resistance of the non-magnetic insulator thin film 151 becomes higher when a skyrmion 40 is present, than when a skyrmion 40 is not present. It is possible to sense the presence or absence of a skyrmion 40, and read information saved in the magnetic element 10 by sensing the resistance. Note that magnetic metal thin films used are magnetic material metal thin films made of Co, Ni, or Fe, or stacked magnetic material metal thin films formed of those magnetic material metal thin films.

The bit line 94 is connected to the magnetic element 10, and applies a constant current to thereby generate a voltage corresponding to the presence or absence of a skyrmion 40 in the corresponding magnetic element 10. That is, the bit line 94 functions as a skyrmion sensing line. The bit line 94 is an exemplary second selection line.

Note that the sensing element 15 in the present example contacts the upper surface of the magnetic material thin film 11. However, the sensing element 15 may be a sensing element formed by sandwiching the non-magnetic insulator thin film 151 with a magnetic material thin film and a soft magnetic material thin film. The direction of magnetic moments of the soft magnetic material thin film becomes the same as the direction of magnetic moments corresponding to the magnetic structure of the magnetic material thin film 11. If a sensing element with this structure is formed directly on the magnetic material thin film 11, a skyrmion 40 can be sensed at high sensitivity. In this case, the transistor Tr2 to select the sensing element 15 is necessarily required. The transistor Tr1 cannot double as a transistor to select the sensing element 15.

FIG. 4 illustrates the magnetic field generating portion 20 that is a constituent of a skyrmion memory 100 according to the first embodiment. The (x, y, z) coordinate system is illustrated in FIG. 4. The magnetic field generating portion 20 applies the magnetic field H to the magnetic material thin film 11. The magnetic field generating portion 20 in the present example applies the magnetic field H to thereby make the magnetic material thin film 11 enter the ferromagnetic phase. The magnetic field generating portion 20 applies, to the magnetic material thin film 11, the magnetic field H that is substantially perpendicular to the front surface of the thin film-like magnetic material thin film 11. In the present example, the magnetic material thin film 11 has a front surface (one surface) parallel to the x-y plane, and the magnetic field generating portion 20 generates the magnetic field H in the +z direction as indicated by arrows in the magnetic field generating portion 20. The magnetic field generating portion 20 may face the rear surface of the magnetic material thin film 11. The magnetic field generating portion 20 may be spaced apart from or in contact with the magnetic material thin film 11. If the magnetic field generating portion 20 is made of a metal, the magnetic field generating portion 20 preferably is spaced apart from the magnetic material thin film 11. The size of the area over which the magnetic field generating portion 20 faces the magnetic material thin film 11 may not be the same as the area of the magnetic material thin film 11. The magnetic field generating portion 20 may double as a magnetic field generating portion 20 for another magnetic material thin film 11.

Figure 5A:
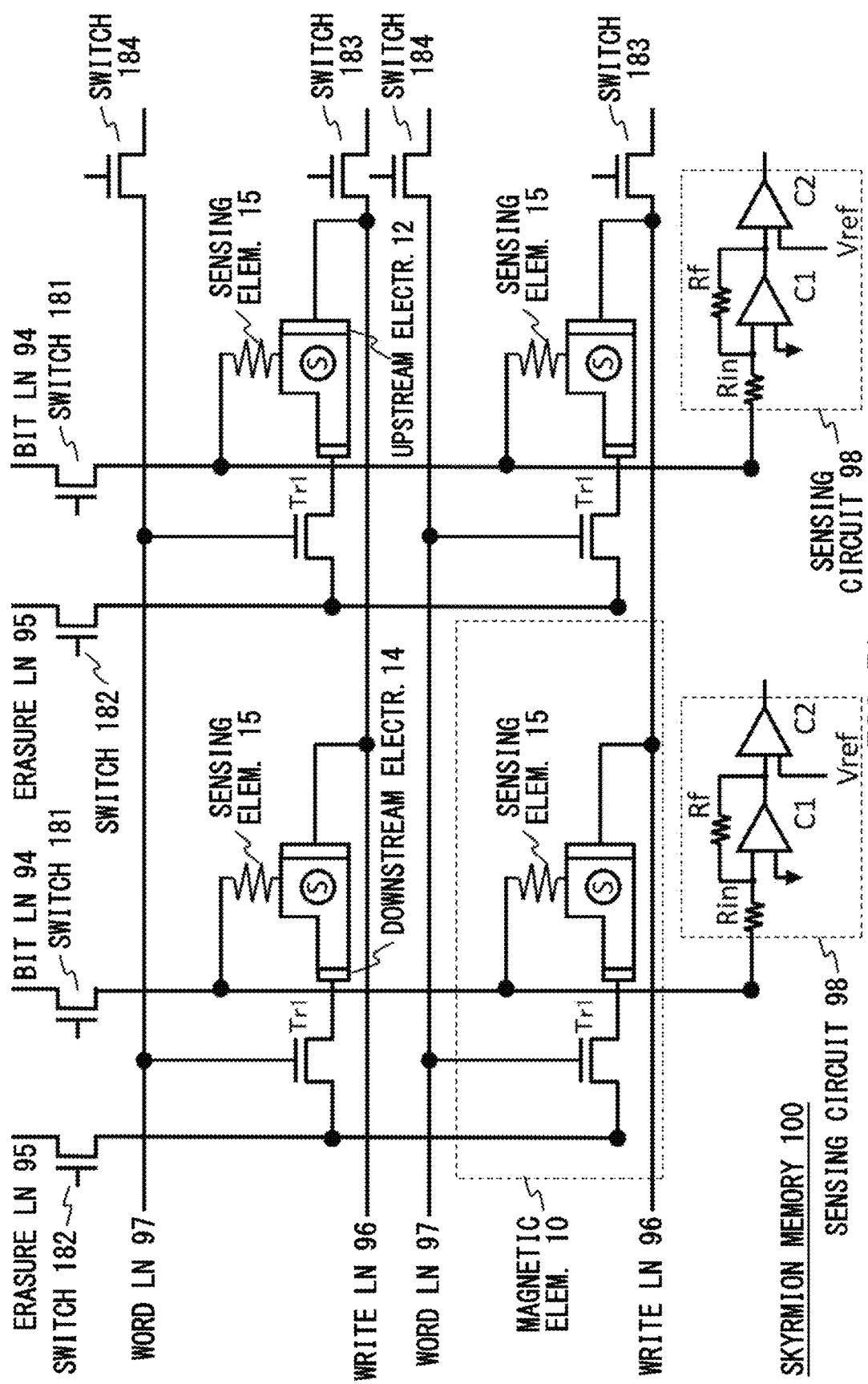
FIG. 5A illustrates an exemplary configuration of a skyrmion memory 100 according to the first embodiment.

FIG. 5A illustrates an exemplary configuration of a skyrmion memory 100 according to the first embodiment. The skyrmion memory 100 in the present example includes magnetic elements 10, each of which is the magnetic element 10 illustrated in FIG. 4. The magnetic elements 10 include L-shaped magnetic material thin films 11. The magnetic elements 10 include upstream electrodes 12, and downstream electrodes 14. The magnetic elements 10 include sensing elements 15. The magnetic elements 10 include transistors Tr1 provided between the downstream electrodes 14 and the erasure lines 95. A major feature of the magnetic elements 10 is that each of them has only one transistor. This transistor Tr1 selects an L-shaped magnetic material thin film, and also selects a sensing element 15. The skyrmion memory 100 in the present example includes a plurality of magnetic elements 10, each of which is the magnetic element 10 illustrated in FIG. 4, the plurality of magnetic elements 10 being arranged in a matrix. FIG. 5A illustrates only some columns and rows among a plurality of columns and rows of the matrix.

The skyrmion memory 100 includes the plurality of magnetic elements 10, a plurality of bit lines 94, a plurality of erasure lines 95, a plurality of write lines 96, a plurality of word lines 97, a plurality of switches 181, a plurality of switches 182, a plurality of switches 183, a plurality of switches 184, and a plurality of sensing circuits 98.

A write line 96 is connected to magnetic elements 10, and supplies generation current that generates skyrmions 40 of the corresponding magnetic elements 10. That is, the write lines 96 function as skyrmion generation lines.

An erasure line 95 is connected to magnetic elements 10, and supplies erasure current that erases skyrmions 40 to the corresponding magnetic elements 10. That is, the erasure lines 95 function as skyrmion erasure lines.

A bit line 94 is connected to magnetic elements 10, and applies a constant current to thereby generate a voltage corresponding to the presence or absence of skyrmions 40 in the corresponding magnetic elements 10. That is, the bit lines 94 function as skyrmion sensing lines.

A word line 97 is connected to magnetic elements 10, and selects a magnetic element 10 that in which a skyrmion 40 is to be generated, erases, and sensed. The word lines 97 in the present example are connected to the gate terminals of transistors Tr1.

A switch 181 is provided to each bit line 94. A switch 182 is provided to each erasure line 95. A switch 183 is provided to each write line 96. A switch 184 is provided to each word line 97. For example, the switches 181, 182, 183, 184 are FETs.

The erasure lines 95, and write lines 96 are connected to external pulse current sources via the individual switches. The external pulse current sources may be one common pulse current source. In addition, the external pulse current sources may each be provided to one erasure line 95, or may be provided as one common pulse current source for the plurality of erasure lines 95.

Sensing circuits 98 are connected to bit lines 94, and sense the voltages of the bit lines 94. The sensing circuits 98 may each be provided to one bit line 94, or may be provided as one common sensing circuit for the plurality of bit lines 94.

A sensing circuit 98 in the present example amplifies the voltage of a bit line 94, and senses the presence or absence of a skyrmion 40. The sensing circuit 98 includes an input resistor Rin, a feedback resistor Rf, an amplification circuit C1, and a voltage comparison circuit C2. The voltage of the bit line 94 is amplified at the ratio between the input resistor Rin and the feedback resistor Rf. The voltage comparison circuit C2 receives both the output voltage of the amplification circuit C1, and the voltage of the reference voltage Vref to thereby amplify the differential voltage. If the output voltage of the amplification circuit C1 is higher than the reference voltage Vref, the voltage comparison circuit C2 outputs "1". On the other hand, if the output voltage of the amplification circuit C1 is lower than the reference voltage Vref, the voltage comparison circuit C2 outputs "0".

An upstream electrode 12 of a magnetic element 10 is connected to a corresponding write line 96. A downstream electrode 14 is connected to a corresponding erasure line 95. A sensing element 15 is connected to a corresponding bit line 94. If data is to be written into any one of the magnetic elements 10 (i.e., if a skyrmion 40 is to be generated), a corresponding switch 182 and switch 183 are turned on, and a corresponding write line 96 and erasure line 95 are selected.

The transistors Tr1 are provided for selecting magnetic material thin films 11. A transistor Tr1 in the present example is provided between the upstream electrode 12, and the write line 96. The gate terminal of the transistor Tr1 is connected to a word line 97. The transistor Tr1 inhibits a flow of leakage current via a corresponding magnetic element 10 if the magnetic element 10 is not selected. Leakage current generates a skyrmion 40 in an unselected magnetic element 10, and causes incorrect writing. In addition, leakage current erases a skyrmion 40 of an unselected magnetic element 10, and causes incorrect erasure. The skyrmion memory 100 in the present example can block leakage current through the magnetic element 10, and prevents incorrect writing and incorrect erasure. The transistors Tr1 are provided between upstream electrodes 12 and the write lines 96, and/or between downstream electrodes 14 and erasure lines 95. FIG. 5A illustrates an example in which each transistor Tr1 is provided between a downstream electrode 14 and an erasure line 95.

In addition, by being provided between a downstream electrode 14 and an erasure line 95, a transistor Tr1 can select a sensing element 15 of a magnetic element 10 from which data is desired to be read out. The transistor Tr1 allows the resistance between a sensing element 15 of an unselected magnetic element 10 and an erasure line 95 to be infinity. Thereby, only the resistance of a sensing element 15 of a selected magnetic element 10 can be read out. A bit line 94 corresponding to a magnetic element 10 from which data is desired to be read out is selected, and a constant current is caused flow through the bit line 94. The voltage of this selected bit line 94 is determined by the resistance indicated by a sensing element 15 of the magnetic element 10 for which a transistor Tr1 is turned on. All the other magnetic elements 10 connected to the selected bit line 94 have the infinite resistance since the transistor Tr1 is turned off. As a result, the voltage of the selected bit line 94 becomes equal to the voltage determined by the resistance of only the TMR element of the selected magnetic element 10.

Figure 5B:
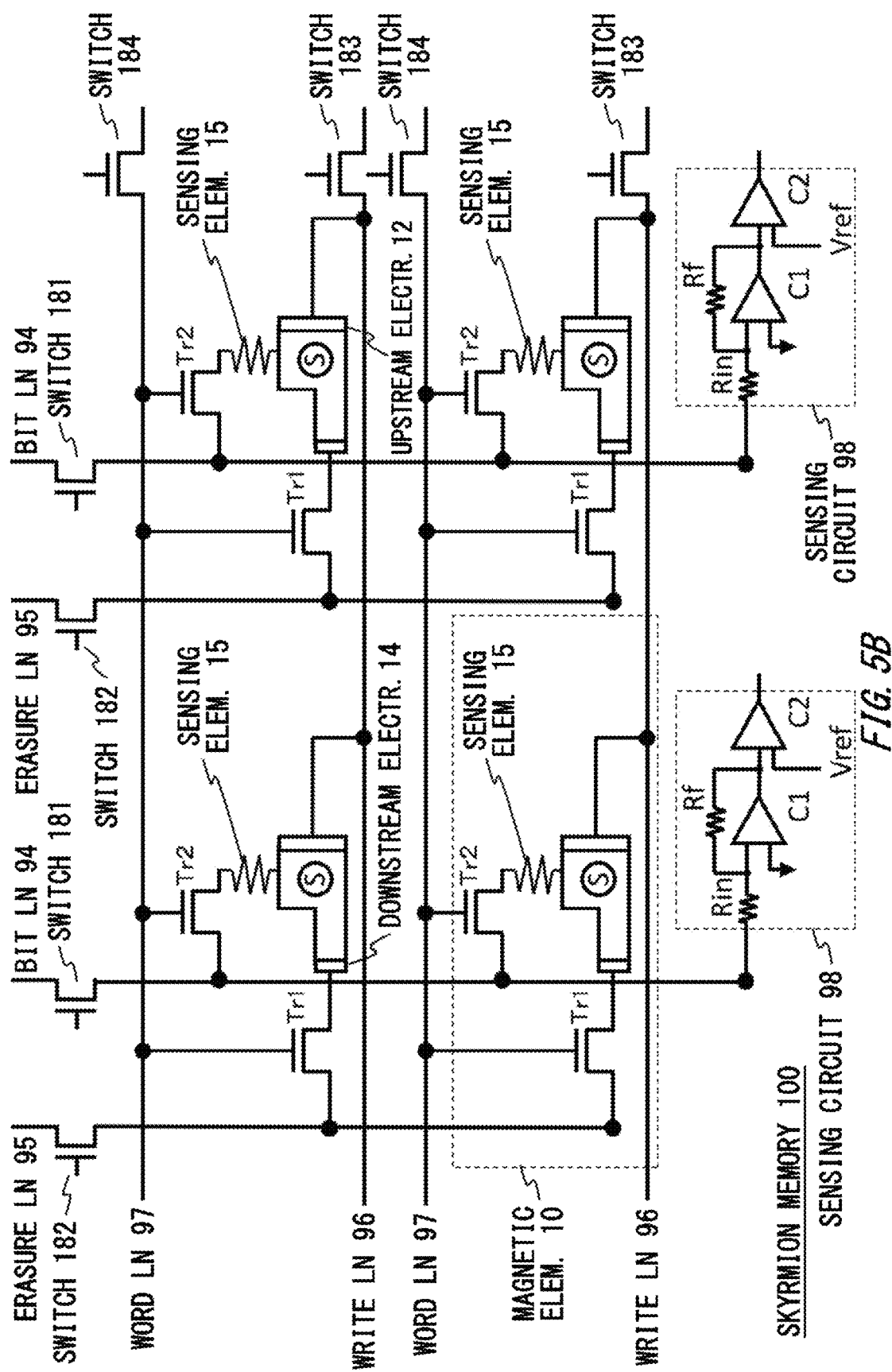
FIG. 5B illustrates an exemplary configuration of the skyrmion memory 100 according to the first embodiment.

FIG. 5B illustrates an exemplary configuration of the skyrmion memory 100 according to the first embodiment. The skyrmion memory 100 in the present example has transistors Tr2 that are provided between bit lines 94 and sensing elements 15. In this case, transistors Tr1 are required for selecting magnetic elements 10. Transistors Tr1, and transistors Tr2 are exemplary transistor portions.

The transistors Tr1 are provided for selecting magnetic material thin films 11. A transistors Tr1 in the present example is provided between a downstream electrode 14 and an erasure line 95. The gate terminal of the transistor Tr1 is connected to a word line 97. The transistor Tr1 inhibits a flow of leakage current via a corresponding magnetic element 10 when the magnetic element 10 is not selected. Thereby, the skyrmion memory 100 in the present example can block leakage currents through magnetic elements 10. The skyrmion memory 100 in the present example can suppress an increase of power consumption while at the same time preventing incorrect writing and incorrect erasure of skyrmions 40.

The transistors Tr2 are provided for directly selecting sensing elements 15. The transistors Tr1 in this circuit cannot select sensing elements 15. A transistor Tr2 is provided between a sensing element 15 and a bit line 94. The gate terminal of the transistor Tr2 is connected to a word line 97. Providing the transistors Tr2 reduces the dependence of the sensitivity of sensing elements 15 on the resistance of magnetic material thin films 11.

As mentioned above, as transistor portions, transistors Tr1 for selecting magnetic material thin films 11 are provided between upstream electrodes 12 and write lines 96, and/or between downstream electrodes 14 and erasure lines 95. Thereby, leakage current in the skyrmion memory 100 can be blocked, and incorrect writing and incorrect erasure can be prevented. If transistors Tr1 are provided between upstream electrodes 12 and write lines 96, sensing elements 15 can be selected furthermore. With a single transistor Tr1, a magnetic element 10 can generate, erase, and sense a skyrmion 40 while at the same time blocking leakage current, and preventing incorrect writing.

If a skyrmion 40 is to be generated and erased in an upper left magnetic element 10 in the skyrmion memory 100 illustrated in FIG. 5A, a switch 183 of an upper write line 96 is turned on. A switch 182 of a left erasure line 95 is turned on. At the same time, a switch 184 of an upper word line 97 is turned on. Thereby, if a voltage is supplied to the upper word line 97, the gate of the transistor Tr1 is turned on. Thereafter, a pulse current for skyrmion generation is applied to the upper write line 96. This pulse current is applied only to the upper left magnetic element 10. Since, although the gate of a transistor Tr1 of an upper right magnetic element 10 is turned on, a switch 182 and a switch 181 of a right erasure line 95 and bit line 94 are turned off, current for generation of a skyrmion 40 does not flow through the upper right magnetic element 10. Thereby, a pulse current for generation flows through only the upper left magnetic element 10, and a leakage current IL never flows through unselected magnetic elements 10. The same applies also to the case where a skyrmion 40 is to be erased.

First Comparative Example

Figure 6:
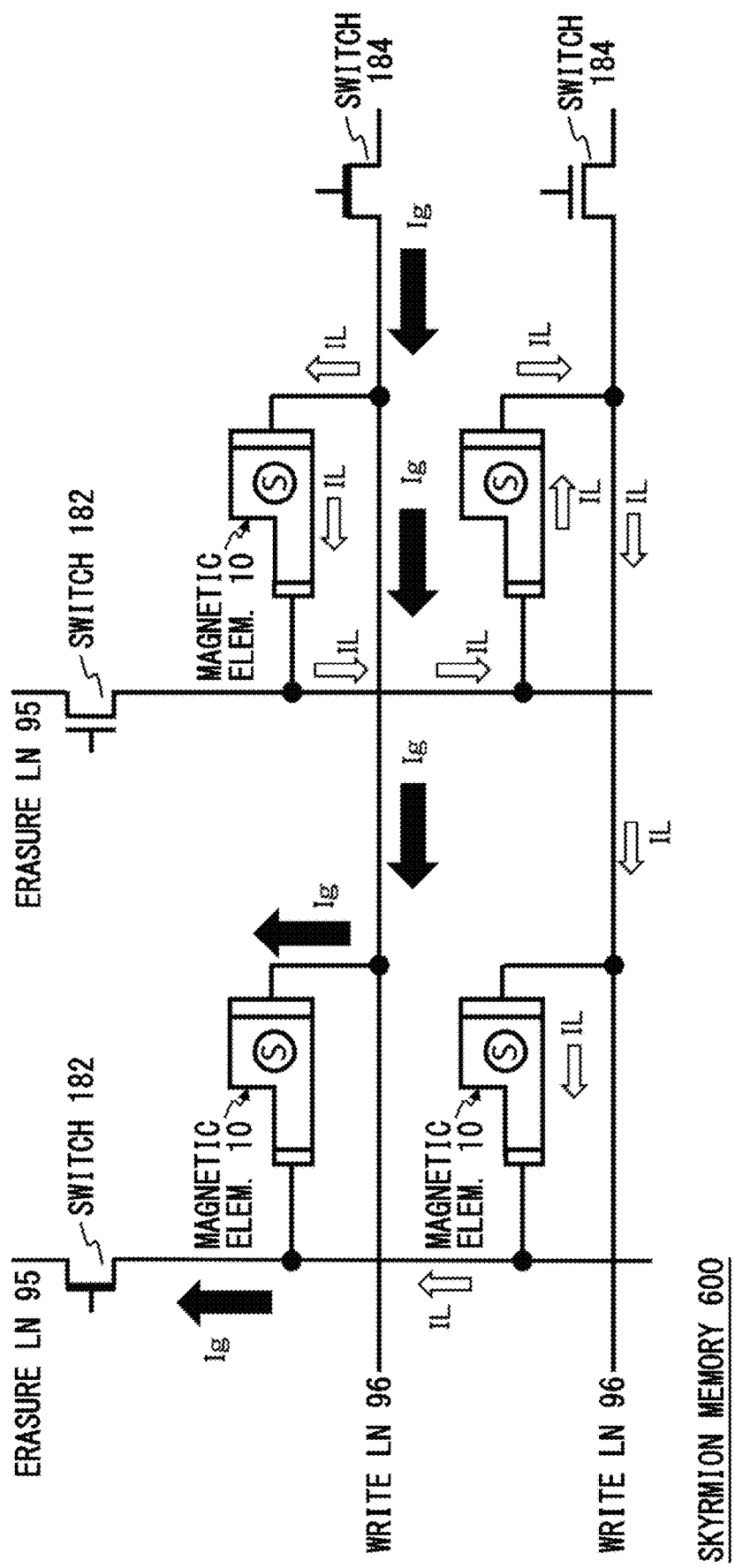
FIG. 6 illustrates the configuration of a skyrmion memory 600 according to a first comparative example.

FIG. 6 illustrates the configuration of a skyrmion memory 600 according to a first comparative example. The skyrmion memory 600 in the present example does not have transistors Tr1. For example, the skyrmion memory 600 in the present example turns on a switch 182 and a switch 184 to thereby cause a generation current Ig to flow through an upper left magnetic element 10. The generation current Ig is indicated by black-painted thick arrows.

Here, in the skyrmion memory 600 in the present example, part of the generation current Ig leaks. Leakage currents IL are indicated by unpainted thick arrows. Since a magnetic material thin film 11 is made of a metal material, the value of a leakage current IL is large. Leakage currents IL can be a cause of incorrect writing and incorrect erasure of skyrmions 40, and an increase of power consumption. Since, in the skyrmion memory 600 in the present example, the direction of leakage currents IL in upper right, and lower left magnetic elements 10 is the same as the direction of a current for generation of a skyrmion 40, this results in skyrmions 40 being generated in the upper right, and lower left magnetic elements 10. That is, incorrect writing occurs. In addition, since the direction of a leakage current IL flowing through a lower right magnetic element 10 is the same as the direction of a current for erasing a skyrmion 40, a skyrmion 40 in the lower right magnetic element 10 is erased inadvertently if the skyrmion 40 is present there. That is, incorrect erasure occurs. In addition, the skyrmion memory 600 has a number of magnetic elements 10 arranged in a matrix. Since a leakage current IL is generated via each magnetic element 10, the skyrmion memory 600 as a whole consumes a large amount of power.

On the other hand, transistors Tr1 according to the first embodiment are provided between upstream electrodes 12 and write lines 96, and/or between downstream electrodes 14 and erasure lines 95. That is, there is a significant difference in that while transistors Tr1 in the present example are each provided to a magnetic material thin film 11 that generates one skyrmion 40, switches 182,184 are each provided to two or more magnetic material thin films 11. Thereby, the skyrmion memory 100 in the first embodiment can block leakage currents through magnetic elements 10. In this manner, the skyrmion memory 100 according to the present specification blocks leakage currents through magnetic elements 10 to thereby be able to prevent incorrect writing and incorrect erasure, and moreover exhibits excellent performance with low power consumption. Furthermore, transistors Tr1 function as transistors to select sensing elements 15. As a result, memory cells can be made smaller, and more densified.

Second Embodiment

Figure 7:
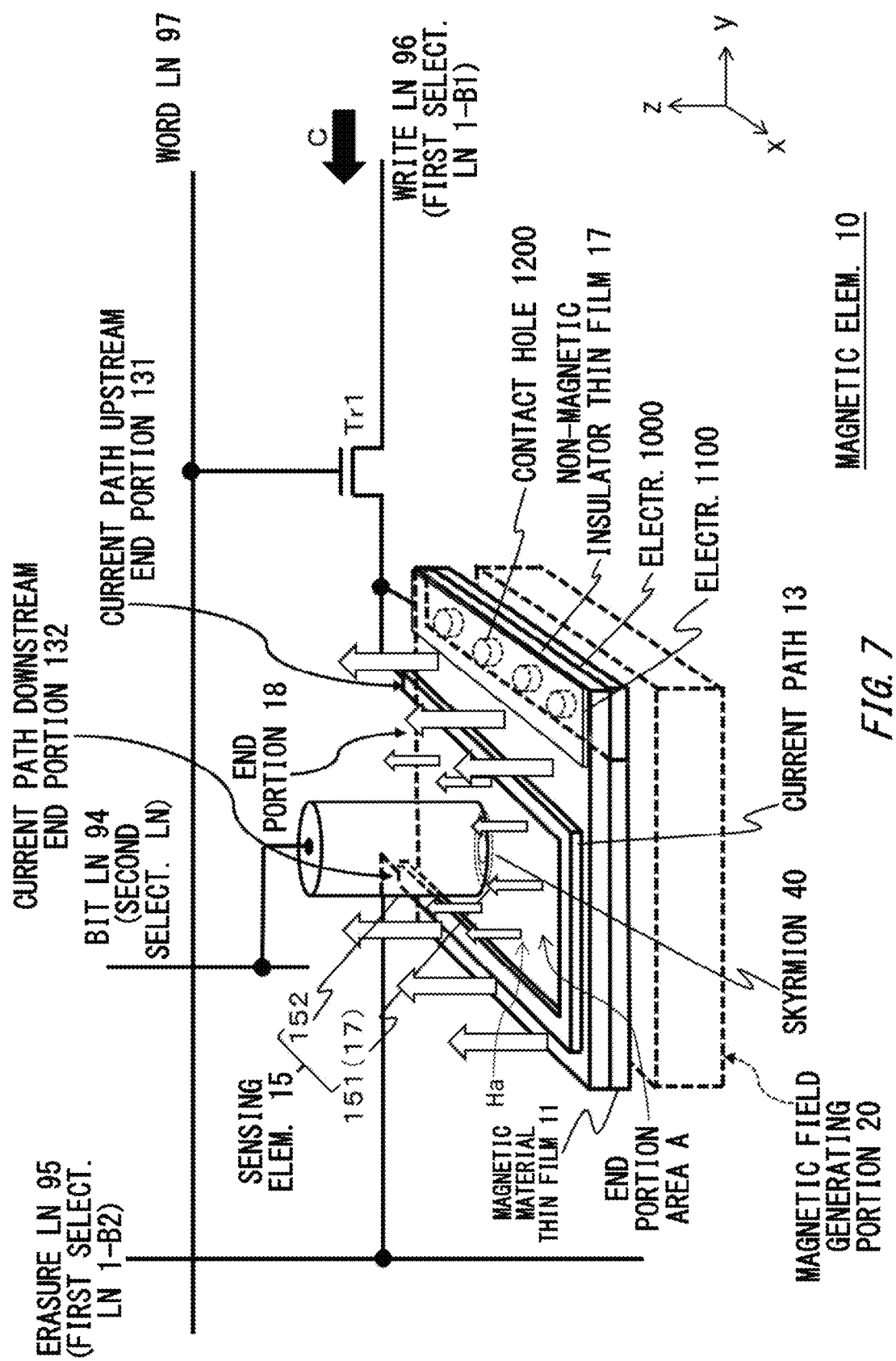
FIG. 7 illustrates an exemplary configuration of a magnetic element 10 according to a second embodiment.

FIG. 7 is a schematic view illustrating a magnetic element 10 according to a second embodiment. The magnetic element 10 in the present example enables generation of a skyrmion 40. The magnetic element 10 saves bit information using the skyrmion 40. For example, the presence or absence of a skyrmion 40 in the magnetic material thin film 11 corresponds to one-bit information. The magnetic element 10 in the present example includes a magnetic material thin film 11, a current path 13, a sensing element 15, a non-magnetic insulator thin film 17, an electrode 1000, an electrode 1100, contact holes 1200, a write line 96, an erasure line 95, a word line 97, and a transistor Tr1. Note that a magnetic field generating portion 20 indicated with dashed lines does not constitute the magnetic element 10.

The magnetic material thin film 11 may be surrounded by an insulating silicon oxide material or the like typically used in semiconductor processes. In addition, the magnetic material thin film 11 is surrounded by a non-magnetic material from all the horizontal directions.

The current path 13 surrounds an area including an end portion of the magnetic material thin film 11 on a surface of the magnetic material thin film 11. The current path 13 may be electrically isolated from the magnetic material thin film 11 using a non-magnetic insulator thin film 17 made of a non-magnetic material, or the like. The current path 13 in the present example is a U-shaped current circuit. A U shape is not limited to a shape with rounded corners, but may be a shape including right-angled corners as in the present example. The current path 13 does not have to form a closed area on the x-y plane. What is required is that a combination of the current path 13 and an end portion 18 form a closed area on the surface of the magnetic material thin film 11. Current flows through the current path 13 in the direction indicated by the arrow C. Due to current flowing through the U-shaped current path 13, a local magnetic field is generated in the magnetic material thin film 11. The current path 13 is formed of a non-magnetic metal material such as Cu, W, Ti, Al, Pt, Au, TiN, or AlSi. In the present specification, the U-shaped area that is formed if the area surrounded by the current path 13 includes an end portion of the magnetic material thin film 11 is particularly called an end portion area A. The current path 13 in the present example has a continuous conduction path that crosses, on the x-y plane, at least once an end portion of the magnetic material thin film 11 from the non-magnetic material thin film side to the magnetic material thin film 11 side, and crosses at least once the end portion from the magnetic material thin film 11 to the non-magnetic material thin film. Thereby, the current path 13 surrounds an area including an end portion of the magnetic material thin film 11. Note that Ha is defined as the magnetic field intensity in the end portion area A.

The current C flowing through the current path 13 generates a magnetic field (−Hc) from the front surface of the magnetic material thin film 11 toward its rear surface in the U-shaped area surrounded by the current path 13. The direction of this magnetic field points to the −z direction. Since the direction of a magnetic field induced by the current flowing through the current path 13 is opposite to the direction of the direction of a uniform magnetic field H from the magnetic field generating portion 20 (the +z axis direction), a magnetic field Ha which is weakened in the direction from the rear surface of the magnetic material thin film 11 toward its front surface is generated in the end portion area A.

$$Ha = H - Hc \quad \text{(Formula 3)}$$

As a result, a skyrmion 40 can be generated in the end portion area A.

If the skyrmion 40 is to be erased, a current may be caused to flow from the erasure line 95. If a current is caused to flow from the erasure line 95, the magnetic field of the end portion area A has the intensity Hc in the direction from the rear surface to the front surface (the +z axis direction). Since it is the same as the direction of the uniform magnetic field H from the magnetic field generating portion 20, the magnetic field Ha which is strengthened in the direction from the rear surface of the magnetic material thin film 11 to its front surface is generated in the end portion area A.

$$Ha = H + Hc \quad \text{(Formula 4)}$$

As a result, the skyrmion 40 can be erased in the end portion area A.

The current path 13 may have a stacked structure of a non-magnetic insulator thin film formed on the magnetic material thin film 11, and a non-magnetic material metal thin film formed on the non-magnetic insulator thin film. In this case, the non-magnetic insulator thin film constituting the current path 13 may consist of a non-magnetic insulator thin film which is the same as a non-magnetic insulator thin film 151 constituting the sensing element 15. For example, the non-magnetic insulator thin film constituting the current path 13, and the non-magnetic insulator thin film 151 share at least any one of processes, materials, and film thicknesses. One end of the current path 13 is a current path upstream end portion 131 connected to the write line 96. The write line 96 is an exemplary first selection line 1-B1. The other end is a current path downstream end portion 132 connected to the erasure line 95. The erasure line 95 is an exemplary first selection line 1-B2.

The current path upstream end portion 131 may be electrically connected with the magnetic material thin film 11. The current path upstream end portion 131 is electrically connected with the electrode 1100, and is electrically connected with the electrode 1000 via the contact holes 1200. In one embodiment, the electrodes 1000, 1100 are made of conductive non-magnetic material metal thin films such as Cu, W, Ti, TiN, Al, Pt, or Au films.

The transistor Tr1 is provided between the current path upstream end portion 131 and the write line 96, or between the current path downstream end portion 132 and the erasure line 95. The gate terminal of the transistor Tr1 is connected to the word line 97. The transistor Tr1 inhibits a flow of leakage current via the corresponding magnetic element 10 when the magnetic element 10 is not selected. Thereby, a skyrmion memory 100 in the present example can block leakage currents through magnetic elements 10. That is, the transistor Tr1 is provided between the current path upstream end portion 131 and the write line 96, and/or between the current path downstream end portion 132 and the erasure line 95.

The sensing element 15 is a tunnel magneto resistance element (TMR element). The sensing element 15 is a sensing element having the same stacked structure as in the first embodiment. The sensing element 15 in the present example is provided between the U-shaped current path 13 and the end portion 18 of the magnetic material thin film 11. The skyrmion 40 sensing function is the same as the sensing function in the first embodiment. In order for the sensing element 15 to function, the magnetic material thin film 11 is used as the other electrode. For that purpose, the non-magnetic metal electrode 1000 is provided at an end portion of the magnetic material thin film 11. The electrode 1000 may be provided at an extension portion of the magnetic material thin film. It may be stacked at an end portion of the magnetic material thin film 11. The contact holes 1200 may be provided for electrical connection to the electrode 1000, and the electrode 1100 may be provided as the upper layer.

A bit line 94 is connected to the magnetic element 10, and applies a constant current to thereby generate a voltage corresponding to the presence or absence of a skyrmion 40 in the corresponding magnetic element 10. That is, the bit line 94 functions as a skyrmion sensing line. The bit line 94 is an exemplary second selection line.

By being provided between a current path upstream end portion 131 and a write line 96, a transistor Tr1 can select a sensing element 15 of a magnetic element 10 from which data is desired to be read out. The transistor Tr1 allows the resistance between a sensing element 15 of an unselected magnetic element 10 and a write line 96 to be infinity. Thereby, only the resistance of a sensing element 15 of a selected magnetic element 10 can be read out.

Figure 8:
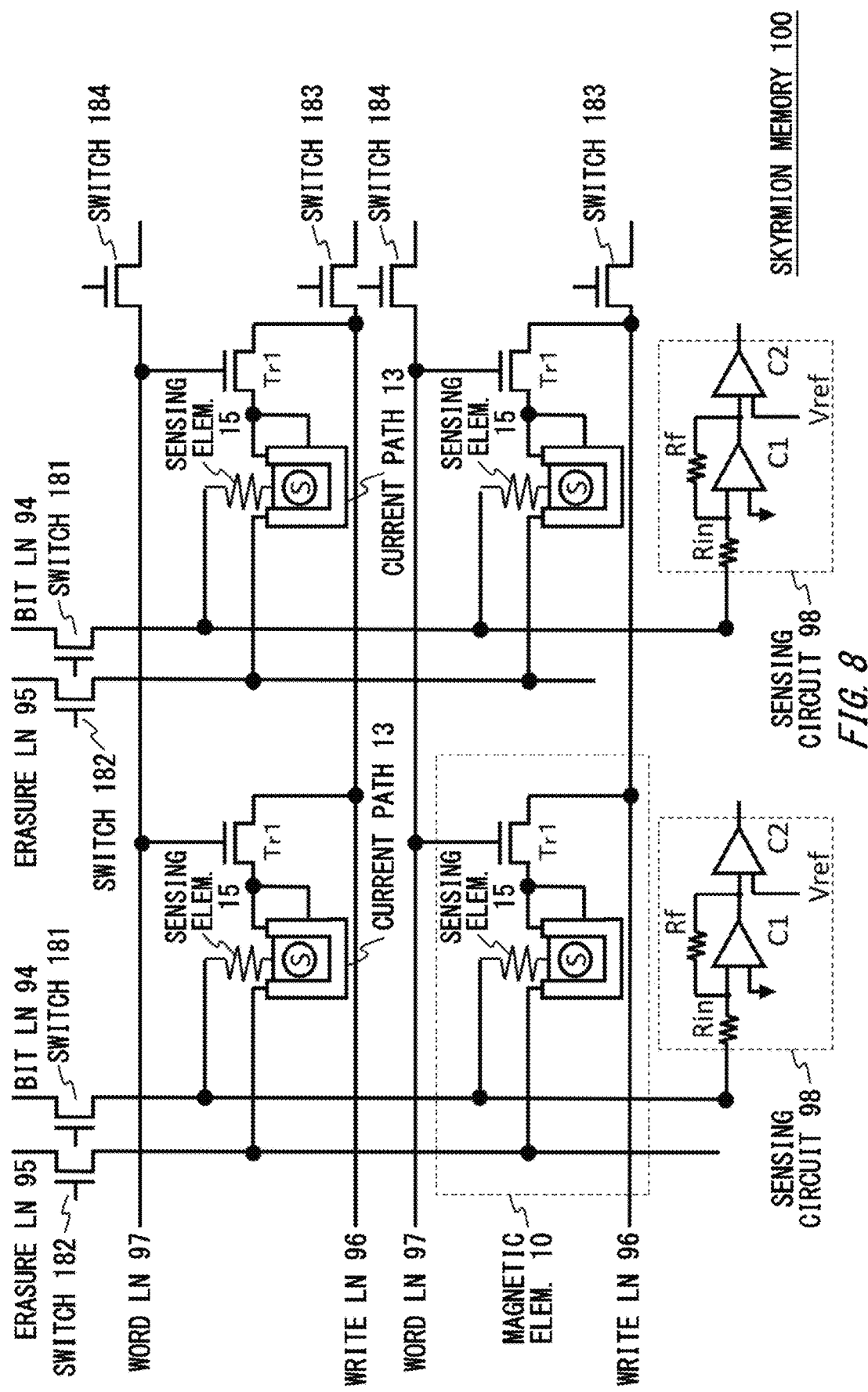
FIG. 8 illustrates an exemplary configuration of a skyrmion memory 100 according to the second embodiment.

FIG. 8 illustrates an exemplary configuration of the skyrmion memory 100 according to the second embodiment. The skyrmion memory 100 in the present example is different from the skyrmion memory 100 according to the first embodiment in that magnetic elements 10 that generate and erase skyrmions 40 using U-shaped current paths 13 are used. That is, the magnetic elements 10 in the present example generate and erase skyrmions 40 using current-induced local magnetic fields. The skyrmion memory 100 in the present example includes U-shaped current paths 13 including end portions of magnetic material thin films. If the current paths have shapes not including end portions of magnetic material thin films, skyrmions 40 cannot be generated. The skyrmion memory 100 in the present example includes a plurality of magnetic elements 10, each of which is the magnetic element 10 illustrated in FIG. 7, the plurality of magnetic elements 10 being arranged in a matrix. FIG. 8 illustrates only some columns and rows among a plurality of columns and rows of the matrix.

The skyrmion memory 100 includes the plurality of magnetic element 10, a plurality of bit lines 94, a plurality of erasure lines 95, a plurality of write lines 96, a plurality of word lines 97, a plurality of switches 181, a plurality of switches 182, a plurality of switches 183, a plurality of switches 184, and a plurality of sensing circuits 98.

A write line 96 is connected to magnetic elements 10, and supplies generation current that generates skyrmions 40 of the corresponding magnetic elements 10. That is, the write lines 96 function as skyrmion generation lines.

An erasure line 95 is connected to magnetic elements 10, and supplies erasure current that erases skyrmions 40 to the corresponding magnetic elements 10. That is, the erasure lines 95 function as skyrmion erasure lines.

A word line 97 is connected to magnetic elements 10, and selects a magnetic element 10 in which a skyrmion 40 is to be generated, erased, and sensed. The word lines 97 in the present example are connected to the gate terminals of transistors Tr1.

A switch 181 is provided to each bit line 94. A switch 182 is provided to each erasure line 95. A switch 183 is provided to each write line 96. A switch 184 is provided to each word line 97. For example, the switches 181, 182, 183, 184 are FETs.

The erasure lines 95, and write lines 96 are connected to external pulse current sources via the individual switches. The external pulse current sources may be one common pulse current source. In addition, the external pulse current sources may each be provided to one erasure line 95, or may be provided as one common pulse current source for the plurality of erasure lines 95.

Sensing circuits 98 are connected to bit lines 94, and sense the voltages of the bit lines 94. The sensing circuits 98 may each be provided to one bit line 94, or may be provided as one common sensing circuit for the plurality of bit lines 94.

A sensing circuit 98 in the present example amplifies the voltage of a bit line 94, and senses the presence or absence of a skyrmion 40. The sensing circuit 98 includes an input resistor Rin, a feedback resistor Rf, an amplification circuit C1, and a voltage comparison circuit C2. The voltage of the bit line 94 is amplified at the ratio between the input resistor Rin and the feedback resistor Rf. The voltage comparison circuit C2 receives both the output voltage of the amplification circuit C1, and the voltage of the reference voltage Vref to thereby amplify the differential voltage. If the output voltage of the amplification circuit C1 is higher than the reference voltage Vref, the voltage comparison circuit C2 outputs "1". On the other hand, if the output voltage of the amplification circuit C1 is lower than the reference voltage Vref, the voltage comparison circuit C2 outputs "0".

Second Comparative Example

Figure 9:
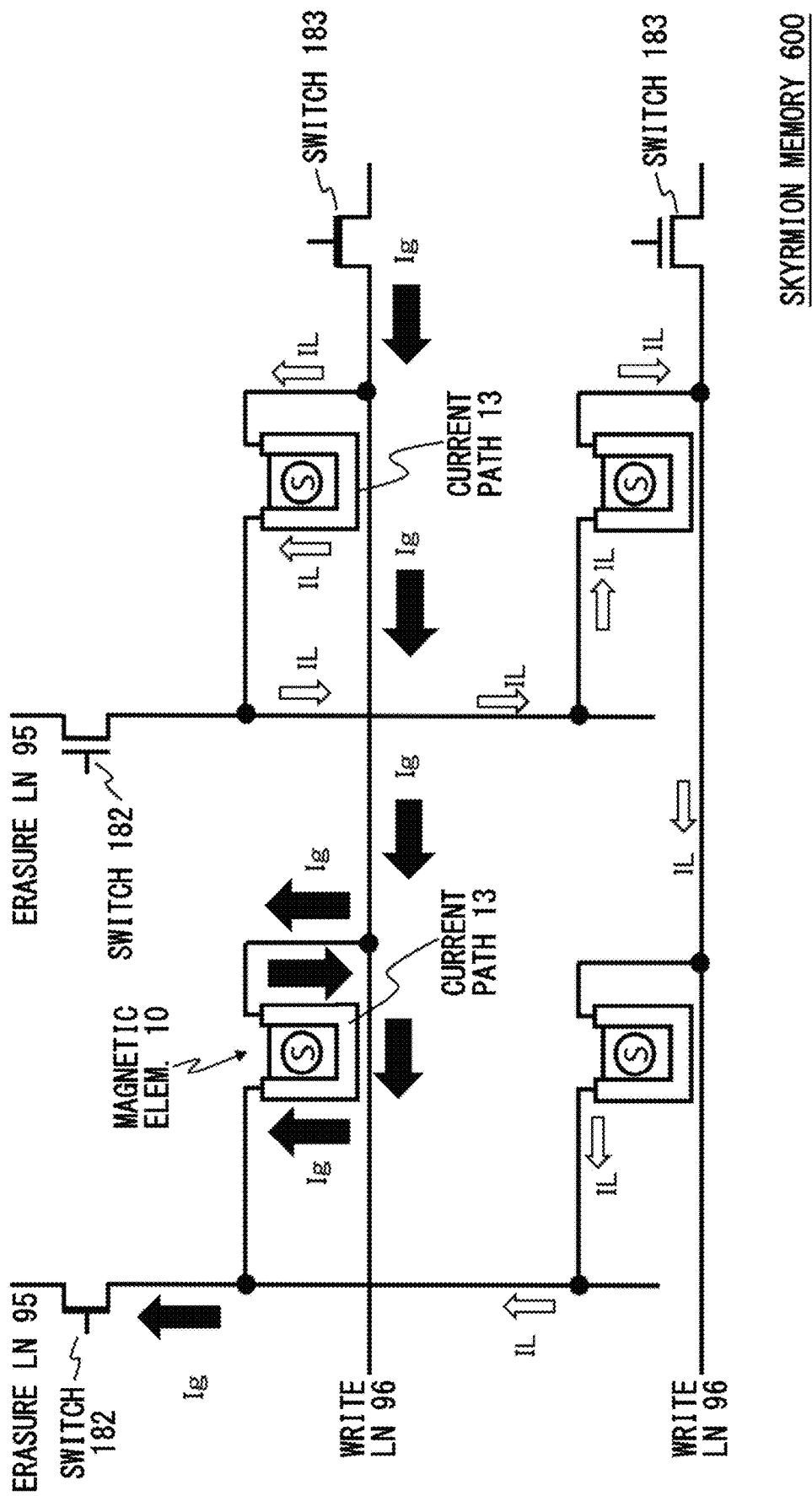
FIG. 9 illustrates an exemplary configuration of a skyrmion memory 600 according to a second comparative example.

FIG. 9 illustrates an exemplary configuration of a skyrmion memory 600 according to a second comparative example. The skyrmion memory 600 in the present example does not have transistors Tr1. For example, the skyrmion memory 600 in the present example turns on a switch 182 and a switch 183 to thereby cause a generation current Ig to flow through a magnetic element 10. The generation current Ig is indicated by black-painted thick arrows.

Here, in the skyrmion memory 600 in the present example, part of the generation current Ig leaks. Leakage currents IL are indicated by unpainted thick arrows. Since a magnetic material thin film 11 is made of a metal material, the value of a leakage current IL is large. Leakage currents IL can be a cause of incorrect writing and incorrect erasure of skyrmions 40, and an increase of power consumption, and the second comparative example is similar to the first comparative example in this respect.

On the other hand, transistors Tr1 according to the second embodiment are provided between current path upstream end portions 131 and write lines 96, or between current path downstream end portions 132 and erasure lines 95. That is, there is a significant difference in that while transistors Tr1 in the present example are each provided to a magnetic material thin film 11 that generates one skyrmion 40, switches 182,184 are each provided to two or more magnetic material thin films 11. Thereby, the skyrmion memory 100 in the second embodiment can block leakage currents through magnetic elements 10. In this manner, the skyrmion memory 100 according to the present specification blocks leakage currents through magnetic elements 10 to thereby be able to prevent incorrect writing and incorrect erasure of skyrmions 40, and has excellent performance with low power consumption. Furthermore, transistors Tr1 function as transistors to select sensing elements 15. As a result, memory cells can be made smaller, and more densified.

Third Embodiment

Figure 10:
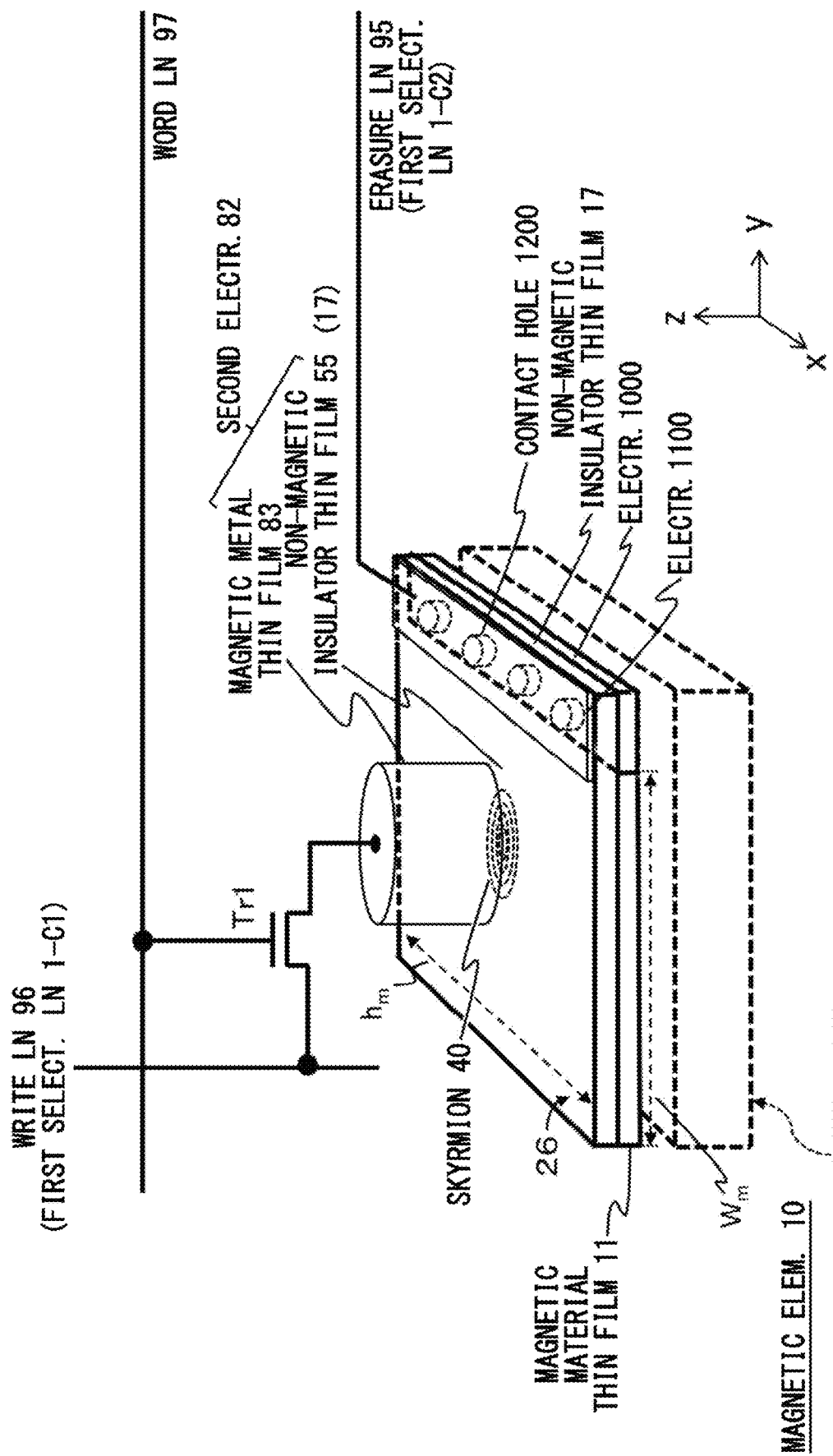
FIG. 10 illustrates an exemplary configuration of a magnetic element 10 according to a third embodiment.

FIG. 10 is a schematic view illustrating an exemplary magnetic element 10 according to a third embodiment. The magnetic element 10 in the present example uses local heat to enable generation of a skyrmion 40. The magnetic element 10 in the present example uses a skyrmion 40 to save bit information. For example, the presence or absence of a skyrmion 40 in the magnetic material thin film 11 corresponds to one-bit information. The magnetic element 10 in the present example includes a magnetic material thin film 11, a second electrode 82, a non-magnetic insulator thin film 17, an electrode 1000, an electrode 1100, contact holes 1200, a write line 96, an erasure line 95, a word line 97, and a transistor Tr1. The write line 96 doubles as a bit line that is an exemplary second selection line. The second electrode 82 is a stacked structure thin film having a non-magnetic insulator thin film 55 provided in contact with an upper portion of another surface 26 of the magnetic material thin film 11, and a magnetic metal thin film 83 provided in contact with an upper portion of the non-magnetic insulator thin film 55. The second electrode 82 doubles as a sensing element. Note that a magnetic field generating portion 20 indicated with dashed lines does not constitute the magnetic element 10.

The magnetic metal thin film 83 is a columnar magnetic metal thin film. A circular cross-sectional area of the magnetic metal thin film 83 equals the area over which it contacts the other surface 26 of the magnetic material thin film 11, and the radius of a circular cross-section of the magnetic metal thin film 83 corresponds to the radius of a spot size of local thermal energy. The non-magnetic insulator thin film 55 is formed between the magnetic metal thin film 83 and the magnetic material thin film 11. The magnetic material thin film 11 is a plate lying parallel to the x-y plane. Note that the magnetic metal thin film 83 used is a magnetic material metal thin film made of Co, Ni, or Fe, or a stacked magnetic material metal thin film formed of such a magnetic material metal thin film.

Note that the magnetic material thin film 11 may be connected to a reference terminal set as a reference potential. The electrode 1000 is connected to the other end of the magnetic material thin film 11. The electrode 1000 may be connected to one end of the magnetic material thin film 11 in its direction of extension. It is connected to the electrode 1100 via the contact holes 1200. The electrode 1100 is connected to the reference potential. In one embodiment, the electrodes 1000,1100 are made of conductive non-magnetic material metal thin films such as Cu, W, Ti, TiN, Al, Pt, or Au films.

Current flows between the magnetic metal thin film 83 and the magnetic material thin film 11 via the transistor Tr1 in a pulse-like manner. When a pulse current flows through the non-magnetic insulator thin film 55 in the second electrode 82, Joule heat is generated in the non-magnetic insulator thin film 55, and heats the magnetic material thin film 11. Local heat corresponding to the size of a circular cross-section of the magnetic metal thin film 83 can be generated in the non-magnetic insulator thin film 55. The pulse-like heat enables generation and erasure of a skyrmion 40 by means of control of thermal energy.

The second electrode 82 doubles as a sensing element. The second electrode 82 is a tunnel magneto resistance element (TMR element). The sensing element 15 is a sensing element having the same stacked structure as in the first embodiment. The skyrmion 40 sensing function is the same as the sensing function in the first embodiment. In order for the sensing element 15 to function, the magnetic material thin film 11 is used as the other electrode. For that purpose, the non-magnetic metal thin film electrode 1000 is provided at an end portion of the magnetic material thin film 11. The electrode 1000 may be provided at an extension portion of the magnetic material thin film 11. The contact holes 1200 may be provided for electrical connection to the electrode 1000, and the electrode 1100 may be provided as the upper layer. The electrode 1000 or electrode 1100 is connected to the erasure line 95.

The transistor Tr1 is provided between the magnetic metal thin film 83 of the second electrode 82, and the write line 96. That the write line 96 doubles as a bit line which is an exemplary second selection line is a major feature of the magnetic element 10. The gate terminal of the transistor Tr1 is connected to the word line 97. The transistor Tr1 inhibits a flow of leakage current via the corresponding magnetic element 10 when the magnetic element 10 is not selected. Thereby, a skyrmion memory 100 in the present example can block leakage currents through magnetic elements 10. That is, the transistor Tr1 is provided between the second electrode 82 and the write line 96, and/or between the magnetic material thin film 11 and the erasure line 95. Note that the write line 96 in the present example is an exemplary first selection line 1-C1. The erasure line 95 in the present example is an exemplary first selection line 1-C2.

In addition, by being provided between a second electrode 82 and a write line 96, a transistor Tr1 can select a sensing element 15 of a magnetic element 10 from which data is desired to be read out. A transistor Tr1 allows the resistance of a write line 96 and an erasure line 95 of a magnetic element 10 connected to the write line 96 but not selected to be infinity. Thereby, only the resistance of a sensing element 15 of a selected magnetic element 10 can be read out.

In the third embodiment, the second electrode 82 which is a generating portion to generate a skyrmion 40 can double as the sensing element 15. Thereby, since the write line 96 can double as a bit line, the space for wiring can be reduced significantly. In addition, the area of the magnetic material thin film 11 can be made small. As a result, the third embodiment can realize a highly dense memory element.

Figure 11:
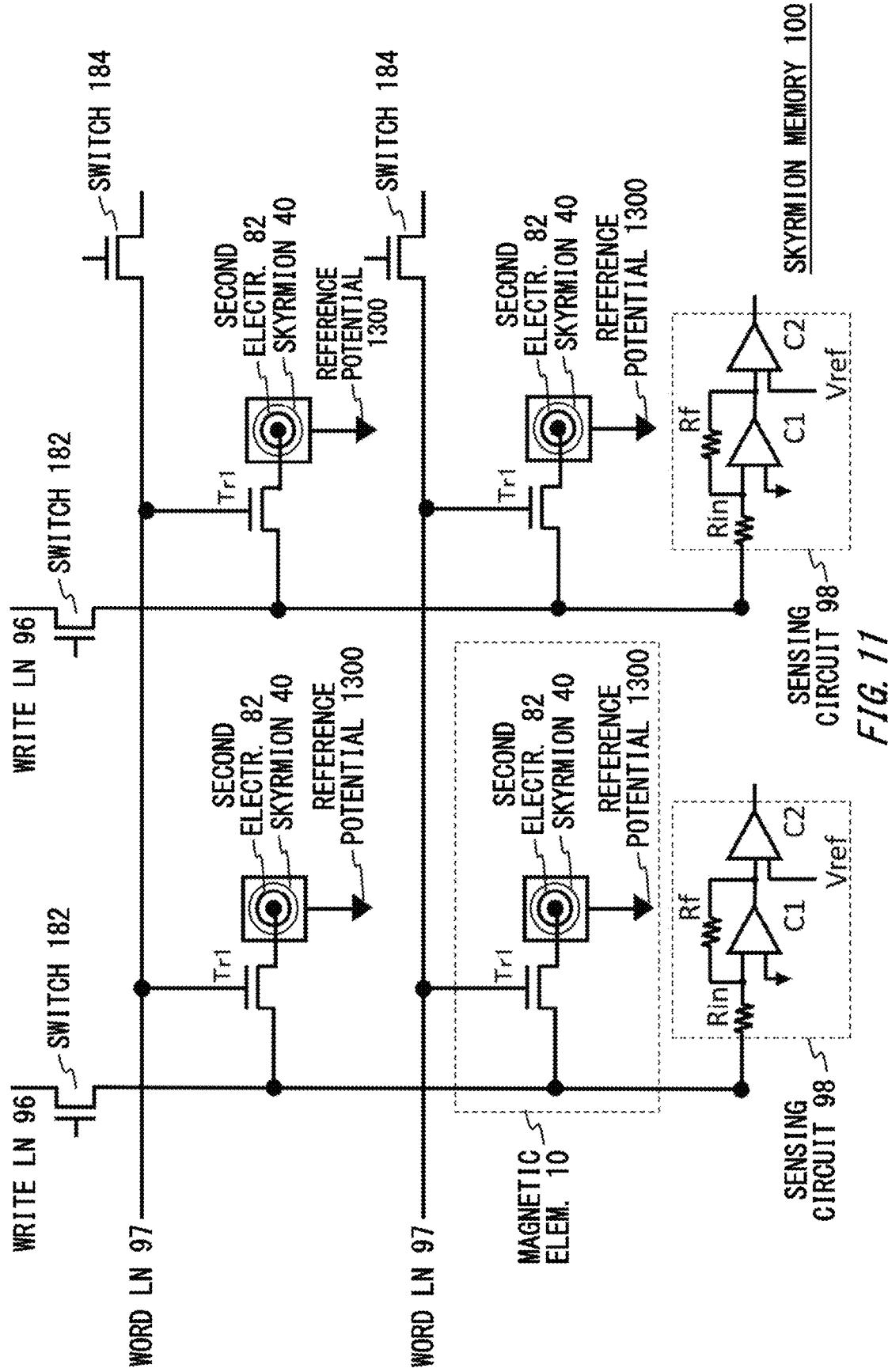
FIG. 11 illustrates an exemplary configuration of a skyrmion memory 100 according to the third embodiment.

FIG. 11 illustrates an exemplary configuration of the skyrmion memory 100 according to the third embodiment. The skyrmion memory 100 in the present example is different from the skyrmion memories 100 according to the first embodiment, and second embodiment in that magnetic elements 10 that generate and erase skyrmions 40 by applying local heat to magnetic material thin films 11 are used. The magnetic element 10 illustrated in FIG. 10 may also be used as the magnetic elements 10 in the present example. Although the magnetic elements 10 in the present example use different principles for generating and erasing skyrmions 40 from those in the other embodiments, basic methods of blocking leakage currents, and of selecting sensing elements 15 are similar to those in the first embodiment, and second embodiment. Magnetic material thin films 11 are connected to reference potentials 1300 through erasure lines 95.

A transistor Tr1 is provided between a magnetic element 10 and a write line 96. In addition, a transistor Tr1 may also be provided between the magnetic element 10 and an erasure line 95. In this case also, the transistors Tr1 can block a leakage current of the magnetic element 10. A skyrmion 40 of a selected magnetic element can also be sensed. The transistor Tr1 is provided between the second electrode 82 and the write line 96, and/or between the magnetic material thin film 11 and the erasure line 95.

Third Comparative Example

Figure 12:
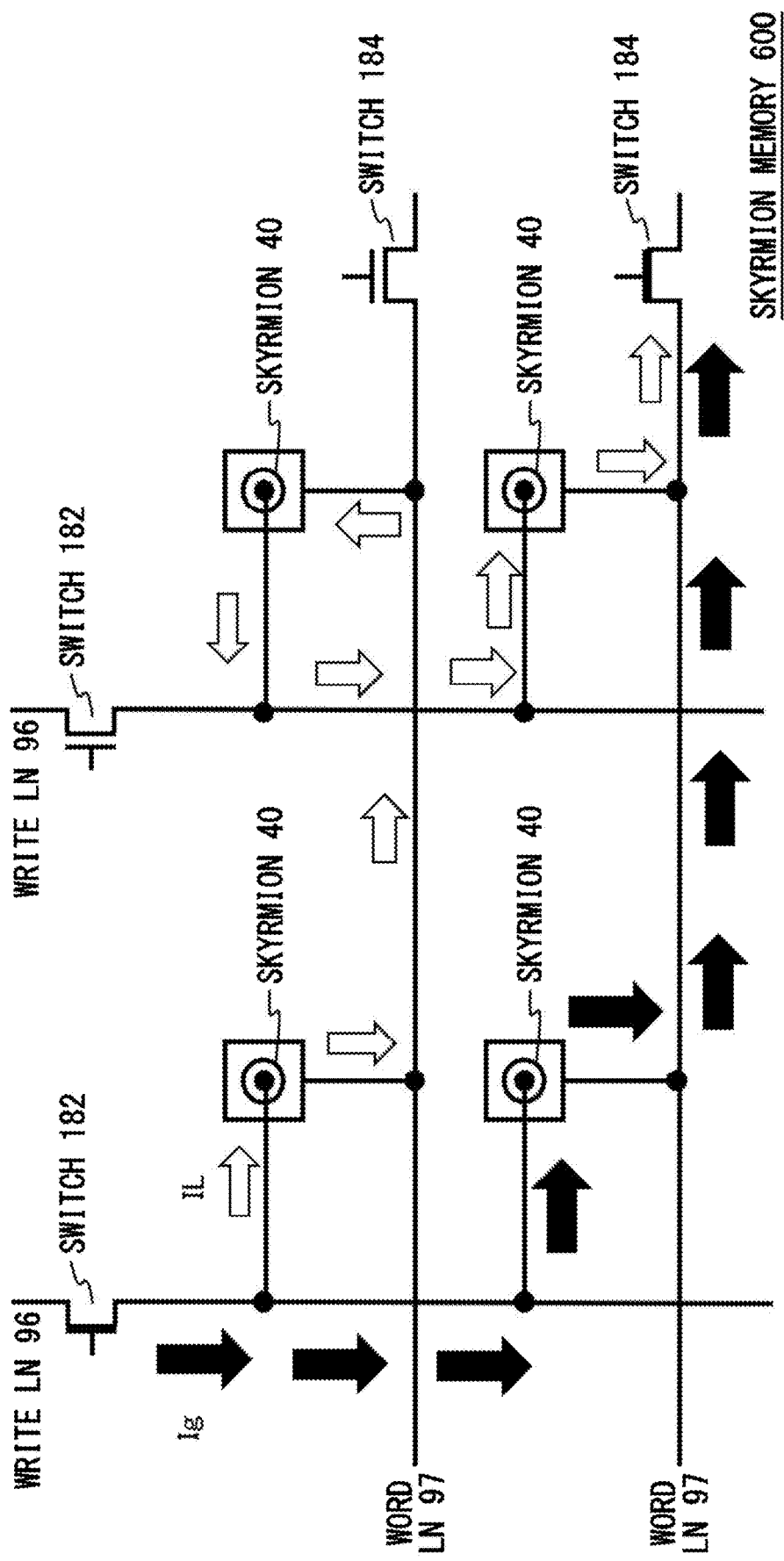
FIG. 12 illustrates the configuration of a skyrmion memory 600 according to a third comparative example.

FIG. 12 illustrates the configuration of a skyrmion memory 600 according to a third comparative example. The skyrmion memory 600 in the present example does not have transistors Tr1. For example, the skyrmion memory 600 in the present example turns on a switch 182 and a switch 184 to thereby cause a generation current Ig to flow through a magnetic element 10. The generation current Ig is indicated by black-painted thick arrows.

Here, in the skyrmion memory 600 in the present example, part of the generation current Ig that flows if local heat is applied leaks. Leakage currents IL are indicated by unpainted thick arrows. Leakage currents IL can be a cause of incorrect writing and incorrect erasure of skyrmions 40, and an increase of power consumption, and the third comparative example is similar to the first comparative example in this respect. If local heat is applied, incorrect writing and incorrect erasure of skyrmions 40 are generated depending on the magnitude of a leakage current IL.

On the other hand, transistor Trs1 according to the third embodiment are provided between second electrodes 82 and write lines 96. Thereby, the skyrmion memory 100 in the third embodiment can block leakage currents through magnetic elements 10. In this manner, the skyrmion memory 100 according to the present specification blocks leakage currents through magnetic elements 10 to thereby prevent incorrect writing and incorrect erasure, and has excellent performance with low power consumption.

Fourth Embodiment

Figure 13:
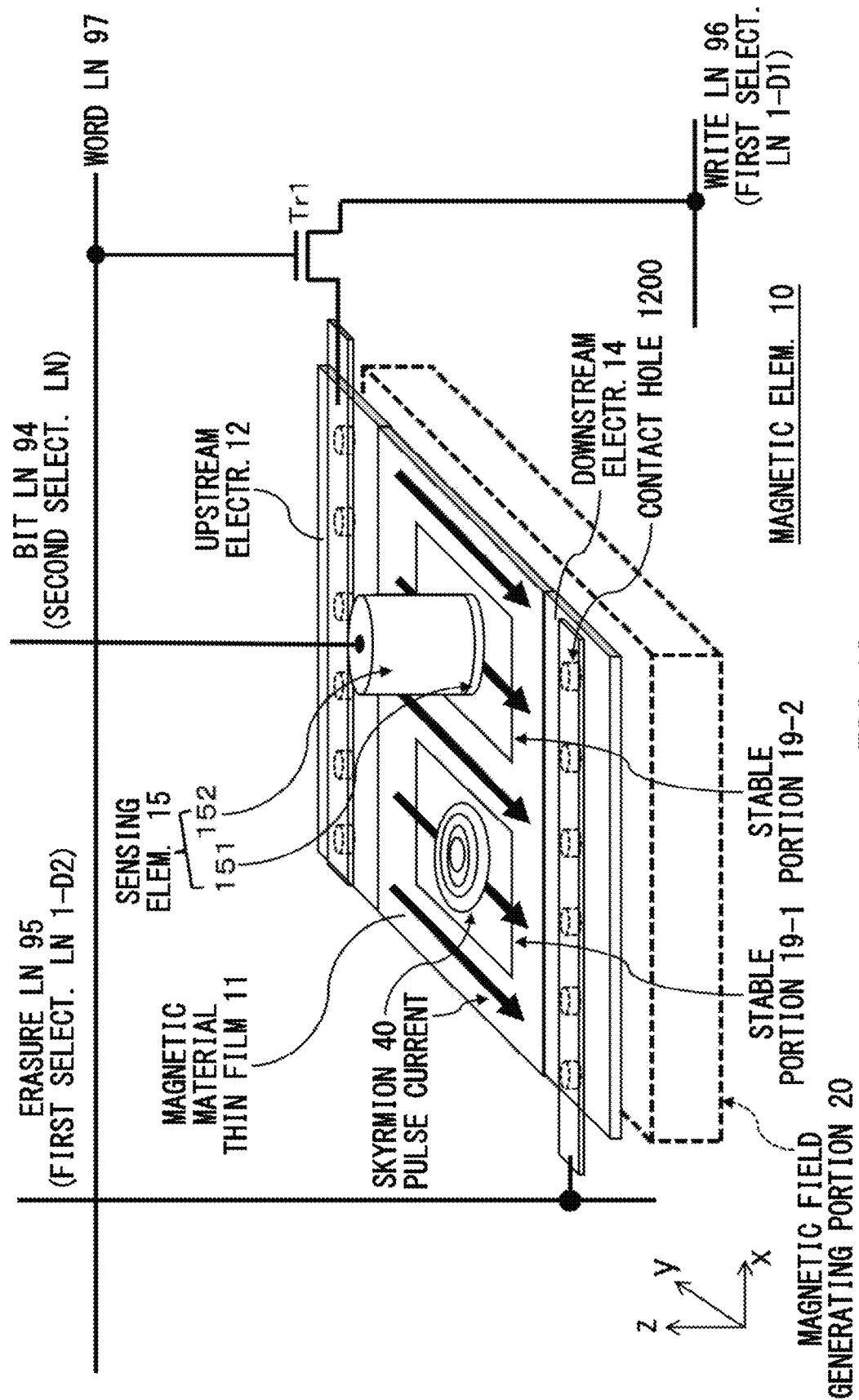
FIG. 13 illustrates an exemplary configuration of a magnetic element 10 according to a fourth embodiment.

FIG. 13 is a schematic view illustrating an exemplary magnetic element 10 according to a fourth embodiment. The magnetic element 10 in the present example enables transfer of a skyrmion 40. In the exemplary configuration of the magnetic element 10 illustrated, the direction of current to flow between an upstream electrode 12 and a downstream electrode 14 is substantially perpendicular to the direction of transfer of a skyrmion 40, which arrangement is called a transverse current arrangement. The magnetic element 10 in the present example includes a magnetic material thin film 11, the upstream electrode 12, the downstream electrode 14, a sensing element 15, a stable portion 19-1, a stable portion 19-2, contact holes 1200, a write line 96, an erasure line 95, a bit line 94, a word line 97, and a transistor Tr1. By causing current for transfer to flow through the magnetic material thin film 11 of the magnetic element 10, it is possible to transfer and arrange a skyrmion 40 in the magnetic material thin film 11 to and in the stable portion 19-1 (first stable portion) or stable portion 19-2 (second stable portion) of the magnetic material thin film 11. A major feature is that the direction of current to flow between the upstream electrode 12 and the downstream electrode 14 is substantially perpendicular to the direction of transfer of a skyrmion 40, which arrangement is called a transverse current arrangement. The sensing element 15 in the present example is provided corresponding to one of a plurality of stable portions 19. The presence or absence of a skyrmion 40 in the stable portion 19-2 of the magnetic material thin film 11 where there is the sensing element 15 corresponds to one-bit information. Note that a magnetic field generating portion 20 indicated with dashed lines does not constitute the magnetic element 10.

The magnetic material thin film 11 has two stable portions 19. The two stable portions 19 are provided in an area which is on the magnetic material thin film 11, and is sandwiched by the upstream electrode 12 and the downstream electrode 14. The magnetic material thin film 11 in the present example has the stable portion 19-1, and the stable portion 19-2. The stable portions 19 are areas where skyrmions 40 can stay more stably than in other areas in the magnetic material thin film 11. The stable portions 19 may be areas where skyrmions 40 stay as long as external force is applied to the skyrmions 40 by current or the like, for example. Formation of such areas can be realized by making the magnetic field intensity of a magnetic field generated there from the magnetic field generating portion 20 lower than the magnetic field intensity of a magnetic field generated around the stable portions 19 in a manner described below. In addition, the stable portions 19 may be areas isolated by some barrier when skyrmions 40 move from the areas. This barrier can be realized by providing the upstream electrode 12 and the downstream electrode 14 with protrusions into the magnetic material thin film 11. Each stable portion 19 occupies a predetermined range on the surface of the magnetic material thin film 11 parallel to the x-y plane. The magnetic element 10 allows transfer of a skyrmion 40 between a plurality of stable portions 19 using current for transfer.

The magnetic field applied to the stable portion 19-1 and stable portion 19-2 of the magnetic material thin film 11 is a magnetic field Ha with an intensity lower than the magnetic field intensity H applied to other areas of the magnetic material thin film 11. For example, the magnetic field generating portion 20 used generates a magnetic field that makes the magnitude of magnetic moments of areas facing the stable portions 19 smaller than that in the other areas.

The upstream electrode 12 is formed of a non-magnetic metal connected to the magnetic material thin film 11. The upstream electrode 12 is connected to one end of the magnetic material thin film 11 in its direction of extension. In the present example, the direction of extension of the magnetic material thin film 11 means the direction parallel to the x-y plane. The upstream electrode 12 may have a thin layer shape. In addition, the upstream electrode 12 may have the same thickness as that of the magnetic material thin film 11.

The downstream electrode 14 is made of a non-magnetic metal that is spaced apart from the upstream electrode 12, and is connected to the magnetic material thin film 11. The downstream electrode 14 is connected to one end of the magnetic material thin film 11 in its direction of extension. The upstream electrode 12, and downstream electrode 14 are arranged such that if a voltage is applied, current for transfer flows through the magnetic material thin film 11 in a direction almost parallel to the x-y plane.

The upstream electrode 12, and downstream electrode 14 are used for transferring a skyrmion 40 in the magnetic material thin film 11. Note that at least one of the upstream electrode 12 and the downstream electrode 14 in the present example functions also as an electrode that cause current to flow through the sensing element 15 that senses the position of a skyrmion 40.

The sensing element 15 in the present example is a tunnel magneto resistance element (TMR element). The sensing element 15 is positioned at at least one stable portion. The sensing element 15 in the present example has a stacked structure of a non-magnetic insulator thin film 151 that contacts the front surface of the magnetic material thin film 11 at the position of the stable portion 19-2, and a magnetic material metal thin film 152. In the present example, the sensing element 15 is provided only at the stable portion 19-2 among the two stable portions 19.

The transistor Tr1 is provided between the upstream electrode 12 and the write line 96 or between the downstream electrode 14 and the erasure line 95. The gate terminal of the transistor Tr1 is connected to the word line 97. The transistor Tr1 inhibits a flow of leakage current via the corresponding magnetic element 10 when the magnetic element 10 is not selected. The write line 96 is an exemplary first selection line 1-D1. The erasure line 91 is an exemplary first selection line 1-D2.

In addition, by being provided between an upstream electrode 12 and a write line 96 or between a downstream electrode 14 and an erasure line 95, a transistor Tr1 can select a sensing element 15 of a magnetic element 10 from which data is desired to be read out. A transistor Tr1 allows the resistance between a write line 96 and a sensing element 15 of a magnetic element 10 connected to the bit line 94 but not selected to be infinity. Thereby, only the resistance of a sensing element 15 of a selected magnetic element 10 can be read out.

The write line 96 is connected to the upstream electrode 12. In addition, the write line 96 may be connected to the upstream electrode 12 via the transistor Tr1. The write line 96 causes transverse current for moving a skyrmion 40 to flow. The current from the write line 96 moves a skyrmion 40 from the stable portion 19-1 to the stable portion 19-2. The sensing element 15 at the stable portion 19-2 determines that there is a skyrmion 40. That is, stored data is "1".

The erasure line 95 is connected to the downstream electrode 14. In addition, the erasure line 95 may be connected to the downstream electrode 14 via the transistor Tr1. The erasure line 95 causes transverse current for moving a skyrmion 40 to flow. The current from the erasure line 95 moves a skyrmion 40 from the stable portion 19-2 to the stable portion 19-1. The sensing element 15 positioned at the stable portion 19-2 determines that there are no skyrmions 40. That is, stored data is zero.

The bit line 94 may be connected to the sensing element 15, and generate a skyrmion 40. The bit line 94 in the present example applies heat to the stable portion 19-2 of the magnetic material thin film 11 to thereby generate a skyrmion 40. In addition, the bit line 94 functions as the bit line 94 that senses whether or not there is a skyrmion 40 in the stable portion 19-2 corresponding to the sensing element 15. The bit line 94 is an exemplary second selection line.

Figure 14:
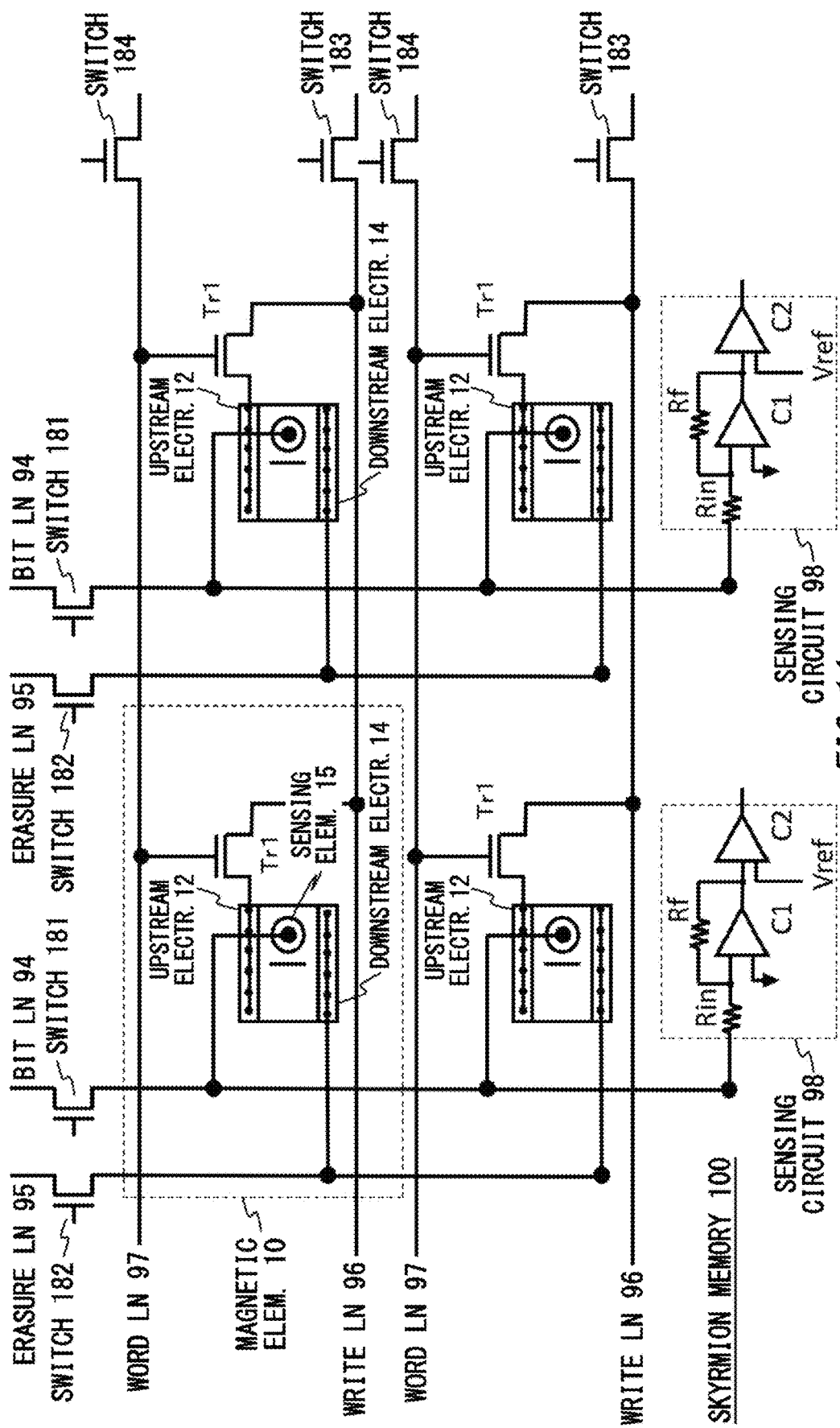
FIG. 14 illustrates an exemplary configuration of a skyrmion memory 100 according to the fourth embodiment.

FIG. 14 illustrates an exemplary configuration of a skyrmion memory 100 according to the fourth embodiment. The skyrmion memory 100 in the present example is different from the skyrmion memories 100 according to the first embodiment to third embodiment in that magnetic elements 10 each having two stable portions for skyrmions 40 are used. Although the magnetic elements 10 in the present example each have two stable portions for skyrmions 40, basic methods of blocking leakage current, and selecting sensing elements are similar to those in the first embodiment, and second embodiment.

A transistor Tr1 in the present example is provided between an upstream electrode 12, and a write line 96. The transistor Tr1 in this case can be used also for selection of a sensing element. In addition, a transistor Tr1 may be provided between a downstream electrode 14 and an erasure line 95.

Fourth Comparative Example

Figure 15:
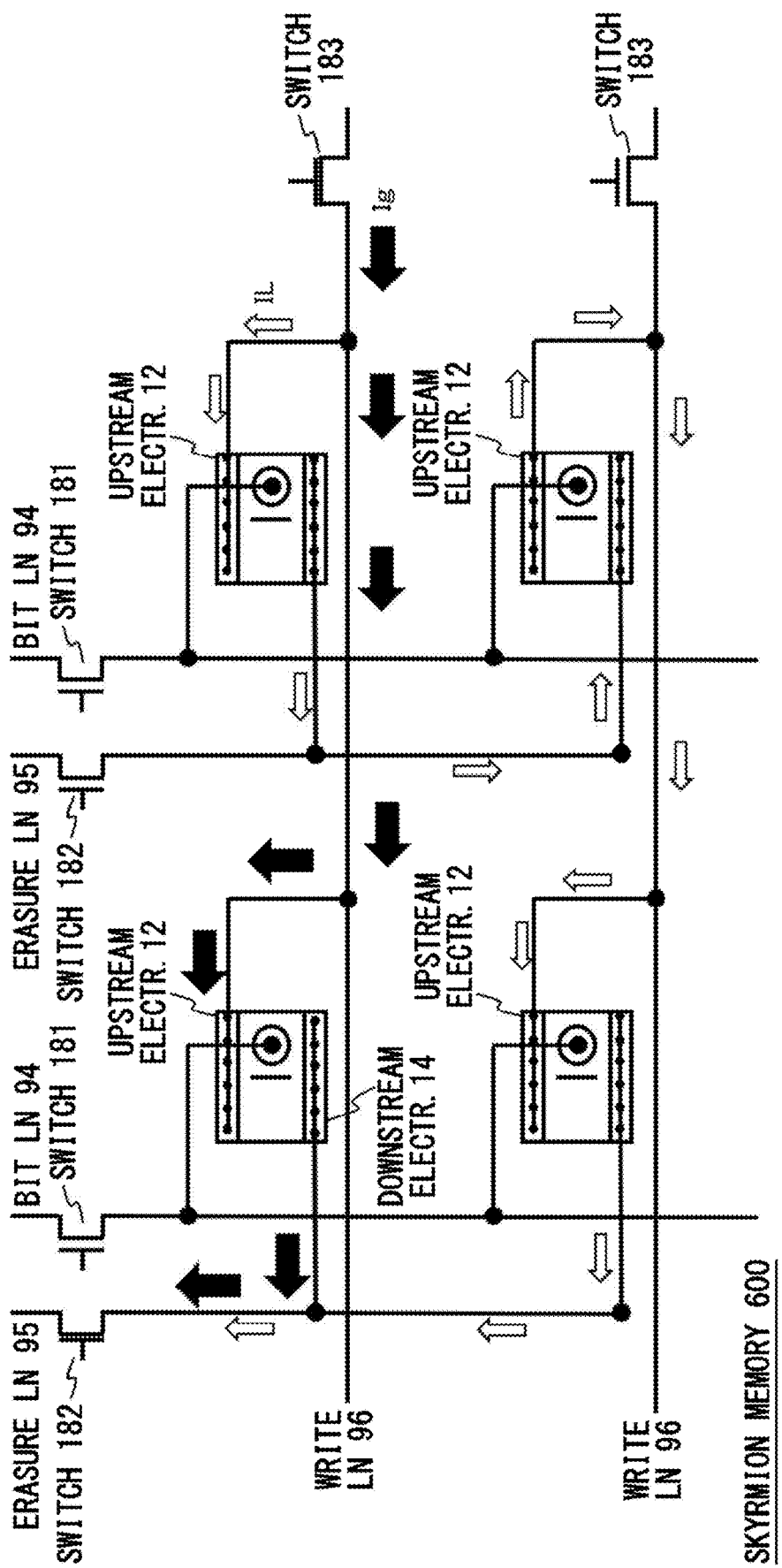
FIG. 15 illustrates an exemplary configuration of a skyrmion memory 600 according to a fourth comparative example.

FIG. 15 illustrates a skyrmion memory 600 according to a fourth comparative example. The skyrmion memory 600 in the present example does not have transistors Tr1. For example, the skyrmion memory 600 in the present example turns on a switch 182 and a switch 183 to thereby cause a generation current Ig to flow through a magnetic element 10. The generation current Ig is indicated by black-painted thick arrows.

Here, in the skyrmion memory 600 in the present example, part of the generation current Ig leaks. Leakage currents IL are indicated by unpainted thick arrows. Since a magnetic material thin film 11 is made of a metal material, the value of a leakage current IL is large. Leakage currents IL can be a cause of incorrect writing and incorrect erasure of skyrmions 40, and an increase of power consumption, and the fourth comparative example is similar to the first comparative example in this respect.

On the other hand, transistors Tr1 according to the fourth embodiment are provided between upstream electrodes 12 and write lines 96 or between downstream electrodes 14 and erasure lines 95. Thereby, the skyrmion memory 100 in the fourth embodiment can block leakage currents through magnetic elements 10. In this manner, the skyrmion memory 100 according to the present specification blocks leakage currents through magnetic elements 10 to thereby prevent incorrect writing and incorrect erasure, and has excellent performance with low power consumption. Furthermore, transistors Tr1 function as transistors to select magnetic elements 10. As a result, memory cells can be made smaller, and more densified.

Figure 16:
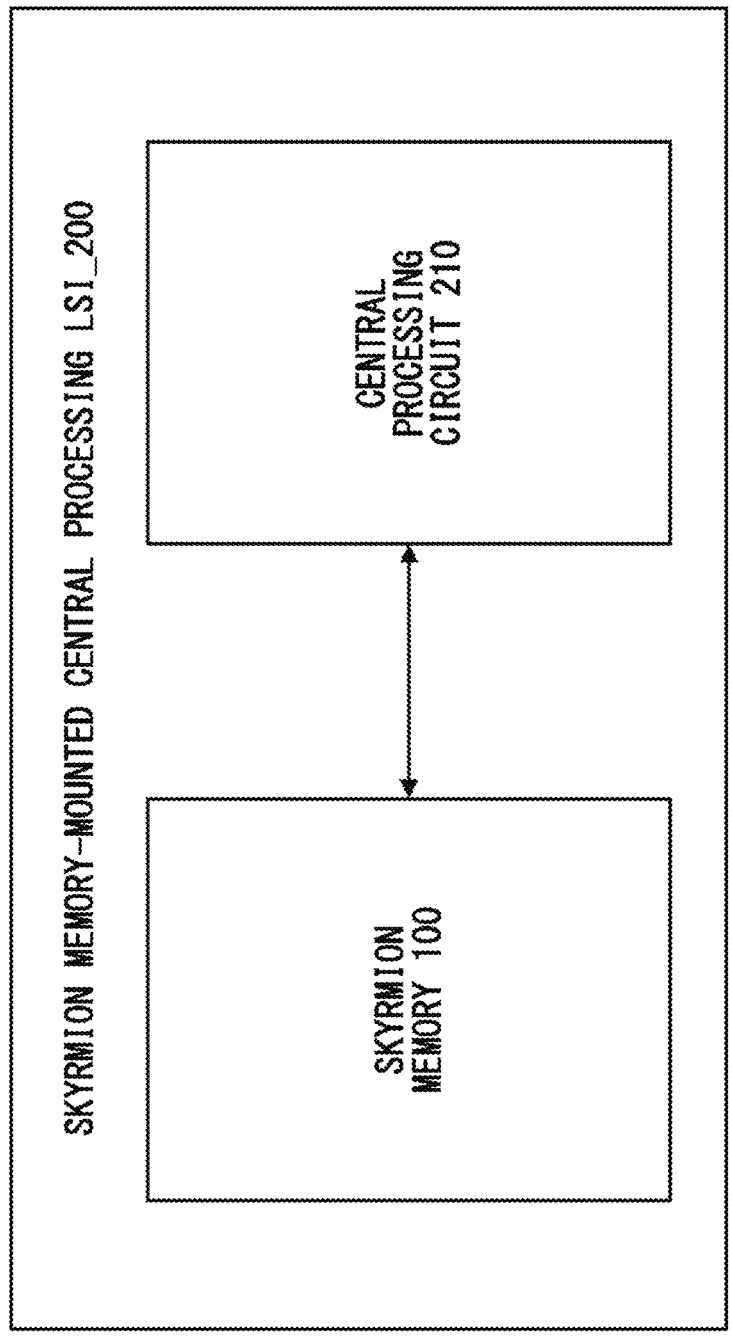
FIG. 16 is a schematic view illustrating an exemplary configuration of a skyrmion memory-mounted central processing LSI_200.

FIG. 16 is a schematic view illustrating an exemplary configuration of a skyrmion memory-mounted central processing LSI_200. The skyrmion memory-mounted central processing LSI_200 includes a skyrmion memory 100, and a central processing circuit 210. The central processing circuit 210 is a CMOS-LSI device, for example. The central processing circuit 210 has the function of writing data into the skyrmion memory 100, and/or the function of reading out data from the skyrmion memory 100. Note that the skyrmion memory 100 may be stacked above a field-effect transistor constituting the skyrmion memory-mounted central processing LSI_200.

Figure 17:
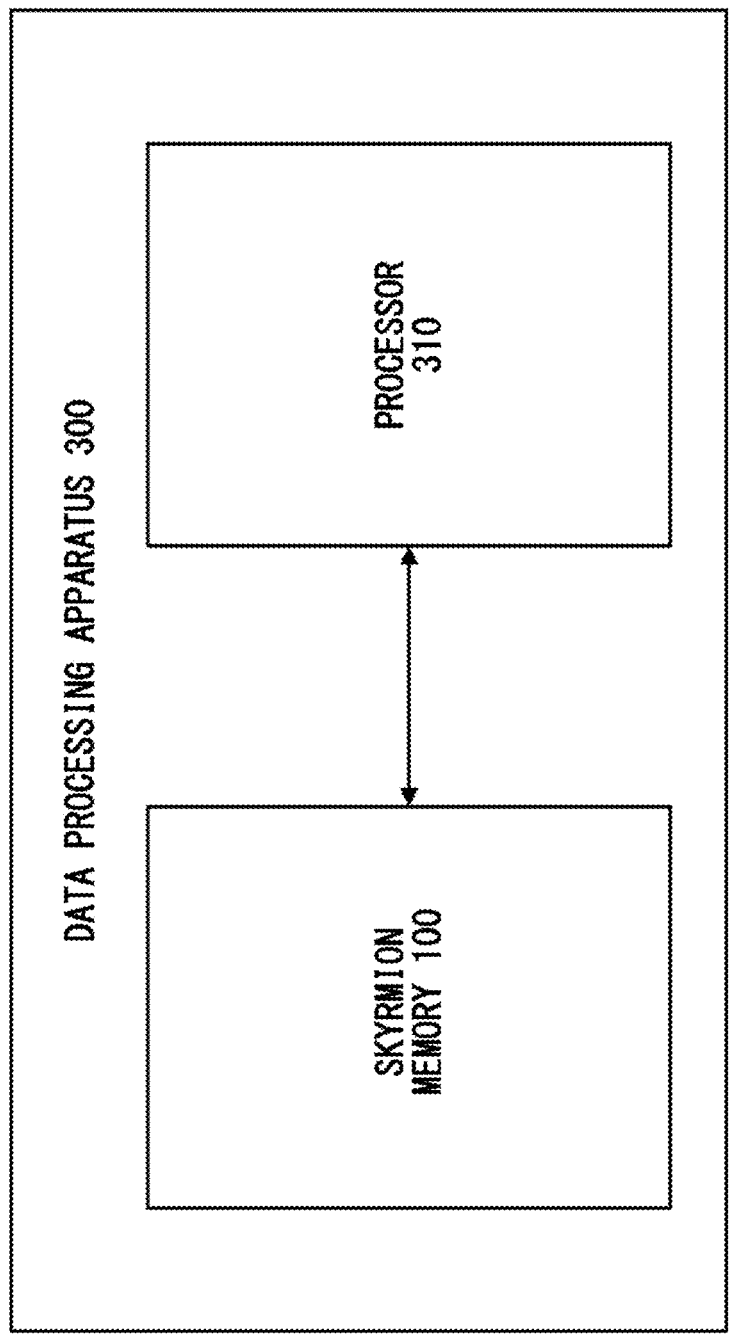
FIG. 17 is a schematic view illustrating an exemplary configuration of a data processing apparatus 300.

FIG. 17 is a schematic view illustrating an exemplary configuration of a data processing apparatus 300. The data processing apparatus 300 includes a skyrmion memory 100, and a processor 310. The processor 310 has a digital circuit that processes digital signals, for example. The processor 310 has the function of writing data into the skyrmion memory 100, and/or the function of reading out data from the skyrmion memory 100.

Figure 18:
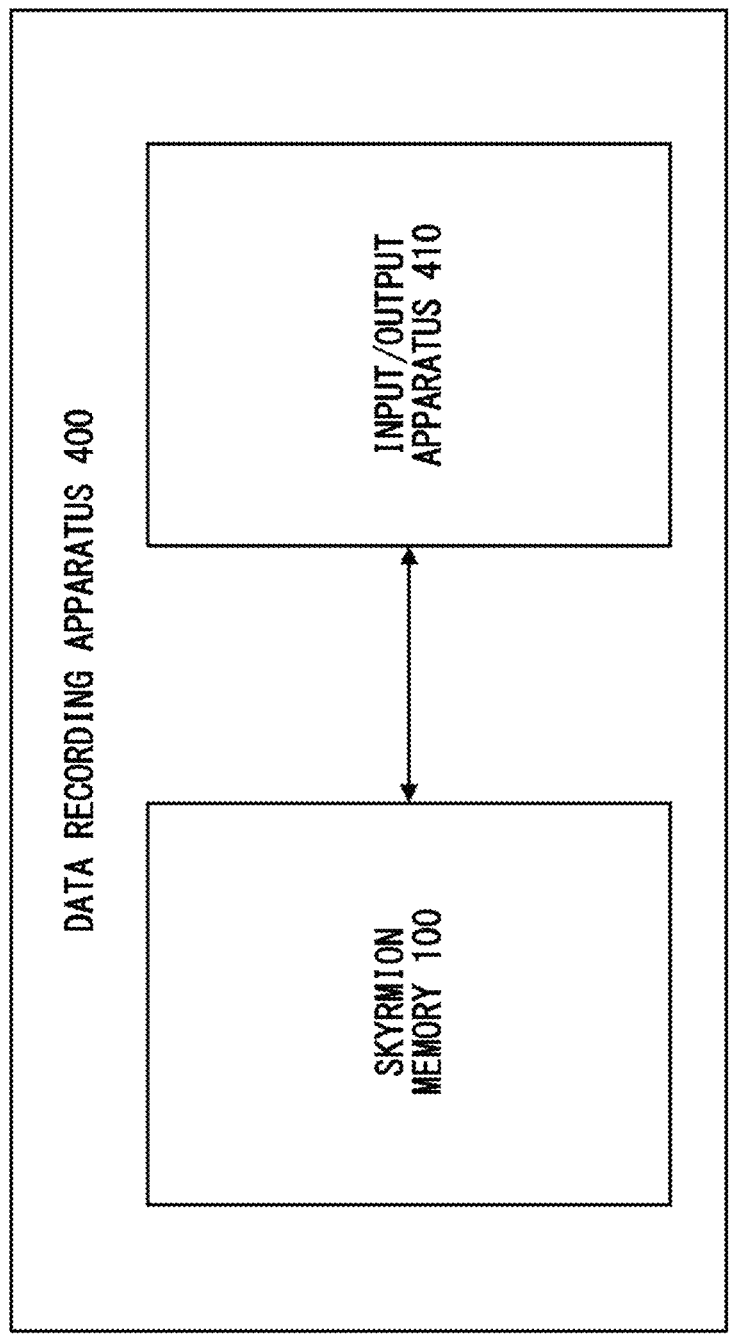
FIG. 18 is a schematic view illustrating an exemplary configuration of a data recording apparatus 400.

FIG. 18 is a schematic view illustrating an exemplary configuration of a data recording apparatus 400. The data recording apparatus 400 includes a skyrmion memory 100, and an input/output apparatus 410. The data recording apparatus 400 is a hard disk or a memory device such as a USB memory, for example. The input/output apparatus 410 has the function of writing data into the skyrmion memory 100 from the outside, and/or the function of reading out data from the skyrmion memory 100 and outputting the data to the outside.

Figure 19:
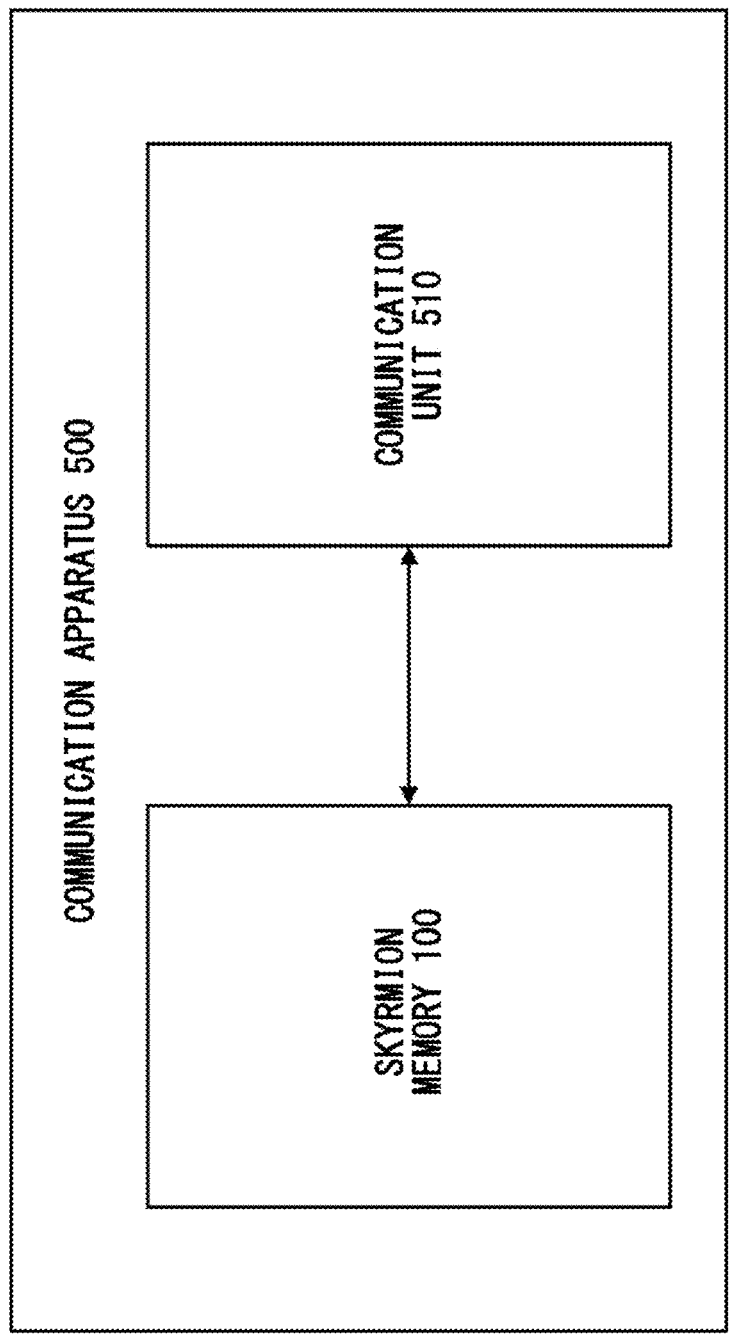
FIG. 19 is a schematic view illustrating an exemplary configuration of a communication apparatus 500.

FIG. 19 is a schematic view illustrating an exemplary configuration of a communication apparatus 500. The communication apparatus 500 is any one of apparatuses in general having the function of communicating with the outside, such as mobile phones, smart phones, or tablet terminals, for example. The communication apparatus 500 may be a portable apparatus, or a non-portable apparatus. The communication apparatus 500 includes a skyrmion memory 100, and a communication unit 510. The communication unit 510 has the function of communicating with the outside of the communication apparatus 500. The communication unit 510 may have a wireless communication function, and/or a cable communication function. The communication unit 510 has at least one of the function of writing data received from the outside into the skyrmion memory 100, the function of sending data read out from the skyrmion memory 100 to the outside, and the function of operating based on control information stored in the skyrmion memory 100.

As explained above, it is possible to provide a magnetic element that can generate, erase, and sense a skyrmion 40 at high speed, and with low power consumption, and a non-volatile skyrmion memory 100, a skyrmion memory-mounted central processing LSI_200, a data processing apparatus 300, a data recording apparatus 400, and a communication apparatus 500 to which the magnetic element is applied.

EXPLANATION OF REFERENCE SYMBOLS

10: magnetic element; 11: magnetic material thin film; 12: upstream electrode; 13: current path; 14: downstream electrode; 15: sensing element; 16: recess; 17: non-magnetic insulator thin film; 18: end portion; 19: stable portion; 20: magnetic field generating portion; 24: first corner; 26: one plane; 40: skyrmion; 55: non-magnetic insulator thin film; 82: second electrode; 83: magnetic metal thin film; 94: bit line; 95: erasure line; 96: write line; 97: word line; 98: sensing circuit; 100: skyrmion memory; 131: current path upstream end portion; 132: current path downstream end portion; 151: non-magnetic insulator thin film; 152: magnetic material metal thin film; 181: switch; 182: switch; 183: switch; 184: switch; 200: skyrmion memory-mounted central processing LSI; 210: central processing circuit; 300: data processing apparatus; 310: processor; 400: data recording apparatus; 410: input/output apparatus; 500: communication apparatus; 510: communication unit; 600: skyrmion memory; 1000: electrode; 1100: electrode; 1200: contact hole; 1300: reference potential; Tr1: transistor; Rin: input resistor; Rf: feedback resistor; C1: amplification circuit; C2: voltage comparison circuit; Vref: reference voltage; IL: leakage current; Ig: generation current

What is claimed is:
1. A magnetic element matrix comprising:
  a plurality of magnetic elements for generating and erasing a skyrmion, each magnetic element including:
  a first magnetic material thin film in which the skyrmion is generated and erased;
  a sensing element for sensing the skyrmion; and
  a transistor portion for selecting the first magnetic material thin film or the sensing element, wherein
  the transistor portion has a first transistor, and
  the first transistor serves as a transistor for selecting the first magnetic material thin film and a transistor for selecting the sensing element.

2. The magnetic element matrix according to claim 1, wherein the sensing element has a stacked structure of a first non-magnetic insulator thin film formed on the first magnetic material thin film, and a second magnetic metal thin film formed on the first non-magnetic insulator thin film.

3. The magnetic element matrix according to claim 1, wherein each magnetic element further includes:
  an upstream electrode formed of a non-magnetic metal connected to one end of the first magnetic material thin film; and
  a downstream electrode formed of a non-magnetic metal connected to another end of the first magnetic material thin film, the end being opposite to the one end to which the upstream electrode is connected.

4. The magnetic element matrix according to claim 3, wherein, within each magnetic element,
the first magnetic material thin film has a corner at an end portion sandwiched by the upstream electrode and the downstream electrode, and
the sensing element is provided between the upstream electrode and the corner of the first magnetic material thin film.

5. The magnetic element matrix according to claim 3, wherein each magnetic element further includes:
a first selection line 1-A1 connected to the upstream electrode; and
a first selection line 1-A2 connected to the downstream electrode, wherein
the transistor portion is provided between the upstream electrode and the first selection line 1-A1, and/or between the downstream electrode and the first selection line 1-A2.

6. The magnetic element matrix according to claim 1, wherein each magnetic element further includes an electrode having a non-magnetic insulator thin film provided on a first surface of the first magnetic material thin film, and a second metal thin film provided on the non-magnetic insulator thin film, and
the first magnetic material thin film generates or erases the skyrmion using Joule heat corresponding to a current applied between the electrode and the first magnetic material thin film.

7. The magnetic element matrix according to claim 6, wherein each magnetic element further includes:
a first selection line 1-C1 connected to the electrode; and
a first selection line 1-C2 connected to the first magnetic material thin film, wherein
the transistor portion is provided between the electrode and the first selection line 1-C1, and/or between the first magnetic material thin film and the first selection line 1-C2.

8. The magnetic element matrix according to claim 1, wherein, within each magnetic element,
the first magnetic material thin film has a plurality of stable portions where the skyrmion stays more stably than in other areas of the first magnetic material thin film, and
each magnetic element has a transverse current arrangement in which a direction of a current to flow between an upstream electrode and a downstream electrode is substantially perpendicular to a direction in which a skyrmion is transferred.

9. The magnetic element matrix according to claim 8, wherein each magnetic element further includes:
a first selection line 1-D1 connected to the upstream electrode; and
a first selection line 1-D2 connected to the downstream electrode, wherein
the transistor portion is provided between the upstream electrode and the first selection line 1-D1, and/or between the downstream electrode and the first selection line 1-D2.

10. A skyrmion memory comprising:
the magnetic element matrix according to claim 1; and
a magnetic field generating portion that faces the first magnetic material thin film, and is capable of applying a magnetic field to the first magnetic material thin film.

11. The skyrmion memory according to claim 10, further comprising a sensing circuit that amplifies a voltage of a second selection line for sensing the skyrmion, and compares the amplified voltage with a reference voltage to sense presence or absence of the skyrmion.

12. A skyrmion memory-mounted central processing LSI comprising a single chip having the skyrmion memory according to claim 10, and a logic circuit element for central information processing.

13. A data recording apparatus comprising the skyrmion memory according to claim 10.

14. A data processing apparatus comprising the skyrmion memory according to claim 10.

15. A data communication apparatus comprising the skyrmion memory according to claim 10.

16. A magnetic element for generating and erasing a skyrmion, the magnetic element comprising:
a first magnetic material thin film in which the skyrmion is generated and erased;
a sensing element for sensing the skyrmion;
a transistor portion for selecting the first magnetic material thin film or the sensing element; and
a current path that surrounds an end portion area including an end portion of the first magnetic material thin film on a surface of the first magnetic material thin film, wherein
the transistor portion has a first transistor,
the first transistor serves as a transistor for selecting the first magnetic material thin film and a transistor for selecting the sensing element,
the sensing element has a stacked structure of a first non-magnetic insulator thin film formed on the first magnetic material thin film, and a second magnetic metal thin film formed on the first non-magnetic insulator thin film, and
the current path has a stacked structure of a second non-magnetic insulator thin film formed on the first magnetic material thin film, and a non-magnetic material metal thin film formed on the second non-magnetic insulator thin film.

17. The magnetic element according to claim 16, wherein the sensing element is provided between the current path and the end portion of the first magnetic material thin film.

18. The magnetic element according to claim 16, comprising:
a first selection line 1-B1 connected to one end of the current path, and the first magnetic material thin film; and
a first selection line 1-B2 connected to the other end of the current path, wherein
the transistor portion is provided between the one end of the current path and the first selection line 1-B1, and/or between the other end of the current path and the first selection line 1-B2.

19. The magnetic element according to claim 18, wherein the first non-magnetic insulator thin film and the second non-magnetic insulator thin film are formed of the same non-magnetic insulator thin film.

20. A magnetic element for generating and erasing a skyrmion, the magnetic element comprising:
a first magnetic material thin film in which the skyrmion is generated and erased;
a sensing element for sensing the skyrmion;
a transistor portion for selecting the first magnetic material thin film or the sensing element; and
an electrode having a non-magnetic insulator thin film provided on a first surface of the first magnetic material thin film, and a second metal thin film provided on the non-magnetic insulator thin film, wherein the transistor portion has a first transistor, the first transistor serves as a transistor for selecting the first magnetic material thin film and a transistor for selecting the sensing element, the first magnetic material thin film generates or erases the skyrmion using Joule heat corresponding to a current applied between the electrode and the first magnetic material thin film, and a stacked structure thin film having (i) the non-magnetic insulator thin film provided on the first surface of the first magnetic material thin film and (ii) a magnetic metal thin film provided on the non-magnetic insulator thin film generates, in the first magnetic material thin film, Joule heat corresponding to a current and serves as the sensing element.

* * * * *